United States Patent
Coumou et al.

(10) Patent No.: US 10,229,816 B2
(45) Date of Patent: Mar. 12, 2019

(54) SOLID-STATE IMPEDANCE MATCHING SYSTEMS INCLUDING A HYBRID TUNING NETWORK WITH A SWITCHABLE COARSE TUNING NETWORK AND A VARACTOR FINE TUNING NETWORK

(71) Applicant: MKS Instruments, Inc., Andover, MA (US)

(72) Inventors: David J. Coumou, Webster, NY (US);
Dennis M Brown, Pittsford, NY (US);
Aaron T. Radomski, Conesus, NY (US);
Mariusz Oldziej, Avon, NY (US);
Yogendra K. Chawla, Fairport, NY (US); Daniel J. Lincoln, Brockport, NY (US)

(73) Assignee: MKS Instruments, Inc., Andover, MA (US)

( * ) Notice: Subject to any disclaimer, the term of this patent is extended or adjusted under 35 U.S.C. 154(b) by 423 days.

(21) Appl. No.: 15/162,960

(22) Filed: May 24, 2016

(65) Prior Publication Data
US 2017/0345620 A1 Nov. 30, 2017

(51) Int. Cl.
*H01J 37/32* (2006.01)
*H03J 7/08* (2006.01)
(Continued)

(52) U.S. Cl.
CPC ...... *H01J 37/32183* (2013.01); *H03F 1/0233* (2013.01); *H03F 1/3223* (2013.01);
(Continued)

(58) Field of Classification Search
None
See application file for complete search history.

(56) References Cited

U.S. PATENT DOCUMENTS 2,745,067 A 5/1956 True et al.
3,117,279 A 1/1964 Ludvigson et al.
(Continued)

FOREIGN PATENT DOCUMENTS

EP 0677221 B1 8/1999

OTHER PUBLICATIONS

International Preliminary Report on Patentability and Written Opinion of the International Searching Authority for PCT Patent Application No. PCT/US2017/023403, dated Nov. 27, 2018.

*Primary Examiner* — Crystal L Hammond
(74) *Attorney, Agent, or Firm* — Harness, Dickey & Pierce, P.L.C.

(57) ABSTRACT

An eVC including coarse and fine tuning networks. The coarse tuning network includes a circuit: receiving a RF input signal from a RF generator; outputting a RF output signal to a reference terminal or load; and receiving a DC bias voltage. The circuit is switched between first and second states. A capacitance of the circuit is based on the DC bias voltage while in the first state and is not based on the DC bias voltage while in the second state. The fine tuning network is connected in parallel with the coarse tuning network and includes a varactor. The varactor includes: a first diode receiving the RF input signal; and a second diode connected in a back-to-back configuration with the first diode and outputting a RF output signal to the reference terminal or load. A capacitance of the varactor is based on a second received DC bias voltage.

43 Claims, 21 Drawing Sheets

(51) Int. Cl.
    *H03H 11/28*     (2006.01)
    *H05K 7/20*     (2006.01)
    *H03F 1/02*     (2006.01)
    *H03F 1/32*     (2006.01)
    *H03F 1/56*     (2006.01)
    *H03F 3/189*     (2006.01)
    *H03F 3/217*     (2006.01)

(52) U.S. Cl.
    CPC .............. *H03F 1/56* (2013.01); *H03F 3/189* (2013.01); *H03F 3/217* (2013.01); *H03H 11/28* (2013.01); *H03J 7/08* (2013.01); *H05K 7/20136* (2013.01); *H01J 2237/334* (2013.01); *H03F 2200/451* (2013.01)

(56) References Cited

U.S. PATENT DOCUMENTS

| | | | |
|---|---|---|---|
| 3,443,231 A | 5/1969 | Roza | |
| 3,601,717 A | 8/1971 | Kuecken | |
| 4,951,009 A * | 8/1990 | Collins | G01R 33/3628 333/17.3 |
| 5,195,045 A * | 3/1993 | Keane | H01J 37/32082 315/111.51 |
| 5,223,457 A | 6/1993 | Mintz et al. | |
| 5,283,462 A * | 2/1994 | Stengel | H03H 1/00 257/310 |
| 5,383,019 A | 1/1995 | Farrell et al. | |
| 5,473,291 A | 12/1995 | Brounley | |
| 5,493,252 A | 2/1996 | Takai | |
| 5,654,679 A | 8/1997 | Mavretic et al. | |
| 5,688,357 A | 11/1997 | Hanawa | |
| 5,892,198 A | 4/1999 | Barnes et al. | |
| 6,020,794 A | 2/2000 | Wilbur | |
| 6,252,354 B1 | 6/2001 | Collins et al. | |
| 6,313,584 B1 * | 11/2001 | Johnson | H01J 37/32082 315/111.21 |
| 6,326,584 B1 | 12/2001 | Jewett et al. | |
| 6,392,210 B1 | 5/2002 | Jewett et al. | |
| 6,417,732 B1 | 7/2002 | Radomski et al. | |
| 6,677,828 B1 | 1/2004 | Harnett et al. | |
| 6,768,472 B2 | 7/2004 | Alexopoulos et al. | |
| 6,887,339 B1 | 5/2005 | Goodman et al. | |
| 6,895,225 B1 | 5/2005 | Talvitie et al. | |
| 7,251,121 B2 | 7/2007 | Bhutta | |
| 7,839,223 B2 | 11/2010 | Van Zyl et al. | |
| 7,923,818 B2 | 4/2011 | De Vreede | |
| 7,929,987 B2 | 4/2011 | Lee et al. | |
| 8,190,109 B2 | 5/2012 | Ali et al. | |
| 8,217,731 B2 | 7/2012 | McKinzie, III | |
| 8,294,514 B2 | 10/2012 | Visser et al. | |
| 8,319,549 B2 * | 11/2012 | Sengupta | H03F 1/0266 330/124 R |
| 8,436,643 B2 | 5/2013 | Mason | |
| 8,576,013 B2 | 11/2013 | Coumou | |
| 8,781,415 B1 * | 7/2014 | Coumou | H03H 7/40 330/149 |
| 9,082,589 B2 * | 7/2015 | Thomas | H01J 37/321 |
| 9,196,459 B2 | 11/2015 | Bhutta | |
| 9,881,772 B2 * | 1/2018 | Marakhatanov | H01J 37/32165 |
| 2004/0132470 A1 | 7/2004 | Checoury et al. | |
| 2006/0232471 A1 | 10/2006 | Coumou | |
| 2007/0139122 A1 | 6/2007 | Nagarkatti et al. | |
| 2008/0061901 A1 | 3/2008 | Gilmore | |
| 2008/0158076 A1 | 7/2008 | Walley | |
| 2008/0191260 A1 | 8/2008 | De Vreede et al. | |
| 2008/0274706 A1 | 11/2008 | Blin | |
| 2009/0278512 A1 | 11/2009 | Karlicek et al. | |
| 2009/0315463 A1 | 12/2009 | Coumou | |
| 2011/0140772 A1 * | 6/2011 | Sengupta | H03F 1/0266 330/2 |
| 2012/0086519 A1 | 4/2012 | Hauer et al. | |
| 2012/0208476 A1 | 8/2012 | Tanoue et al. | |
| 2012/0229228 A1 | 9/2012 | White | |
| 2015/0303033 A1 | 10/2015 | Bhutta | |
| 2015/0348854 A1 * | 12/2015 | Kapoor | H01L 21/0262 438/10 |
| 2016/0064161 A1 | 3/2016 | Bhutta | |
| 2016/0065207 A1 | 3/2016 | Bhutta | |

* cited by examiner

SOLID-STATE IMPEDANCE MATCHING SYSTEMS INCLUDING A HYBRID TUNING NETWORK WITH A SWITCHABLE COARSE TUNING NETWORK AND A VARACTOR FINE TUNING NETWORK

CROSS-REFERENCES TO RELATED APPLICATIONS

This application is related to U.S. Pat. No. 8,576,013 issued on Nov. 5, 2013 and titled "POWER DISTORTION-BASED SERVO CONTROL SYSTEMS FOR FREQUENCY TUNING RF POWER SOURCES" and U.S. Pat. No. 8,781,415 issued on Jul. 15, 2014 and titled "DISTORTION CORRECTION BASED FEEDFORWARD CONTROL SYSTEMS AND METHODS FOR RADIO FREQUENCY POWER SOURCES". The entire disclosures of these U.S. patents are incorporated herein by reference.

FIELD

The present disclosure generally relates to impedance matching networks.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Plasma etching is frequently used in semiconductor fabrication. In plasma etching, ions are accelerated by an electric field to etch exposed surfaces on a substrate. The electric field is generated based on RF power signals generated by a radio frequency (RF) generator of a RF power system. The RF power signals generated by the RF generator must be precisely controlled to effectively execute plasma etching.

A RF power system may include a RF generator, a matching network and a load (e.g., a plasma chamber). The RF generator generates RF power signals, which are received at the matching network. The matching network matches an input impedance of the matching network to a characteristic impedance of a transmission line between the RF generator and the matching network. This impedance matching aids in maximizing an amount of power forwarded to the matching network ("forward power") and minimizing an amount of power reflected back from the matching network to the RF generator ("reverse power"). Forward power may be maximized and reverse power may be minimized when the input impedance of the matching network matches the characteristic impedance of the transmission line.

An RF matching network may include a load capacitance and a tune capacitance. The load capacitance is connected in parallel with a load (e.g., plasma chamber) and the tune capacitance is connected in series between an RF input and the load. The load capacitance and/or the tune capacitance may include a switching network. The switching network typically includes field effect transistors (FETs) and/or p-type intrinsic n-type (PIN) diodes. A PIN diode has a binary state (i.e. either ON or OFF).

A switching network including FETs and/or PIN diodes is complex due to the number of diodes required. PIN diodes are susceptible to breakdown and are relatively expensive. Switching of the PIN diodes to vary the overall capacitance of a load capacitance or a tune capacitance is performed in a discontinuous fashion. Switching of PIN diodes can cause discontinuous jumps in a resonant frequency and impedance of a matching network, which can be seen by a RF source providing an RF signal to an input of the matching network. In addition, switching of the PIN diodes can cause off resonance operation of the RF source while the resonant frequency is re-established by a feedback control loop. Off-resonance operation can cause significant stress on the FETs. To reduce the stated problems requires, for example, the FETs have an associated capacitor and driving circuit.

Various challenges exist with switching PIN diodes. A capacitance associated with a PIN diode is switched into a circuit by applying a bias voltage across the PIN diode. FIG. 1 shows an example schematic diagram of a traditional dual-pin diode circuit 10 of an impedance matching circuit. The dual-PIN diode circuit 10 includes PIN diodes 14, 16 and corresponding capacitors $C_{n1}$, $C_{n2}$. The PIN diodes 14, 16 are connected in series respectively with the capacitors $C_{n1}$, $C_{n2}$ between an RF input terminal 18 and an RF output terminal 20. The PIN diodes 14, 16 receive respectively bias voltages $V_{SWT1}$, $V_{SWT2}$.

When one or more of the PIN diodes 14, 16 are forward biased, the dual-PIN diode circuit 10 is in conduction mode and current is permitted to flow between the terminals 18, 20. As a result, the capacitors $C_{n1}$, $C_{n2}$ are applied to the impedance matching circuit. Conversely, when the PIN diodes are reverse biased, current flow is prevented and in this open-circuit condition, the capacitors $C_{n1}$, $C_{n2}$ are removed from the impedance matching circuit. As an alternative to using PIN diodes, FET switches can be used. In a FET switch implementation, each individual diode performs as a binary switch having an ON (or conduction) state and an OFF (or open) state. An impedance matching network may include a network of PIN diodes to switch a set of capacitors to cover a capacitance range necessary to cover an impedance space associated with a process range of a reactor (or plasma chamber).

Tuning Resolution

A significant disadvantage of using PIN diodes to switch in capacitors is tuning resolution. Several PIN diodes and associated capacitors are necessary to provide a suitable capacitance range to cover a predetermined impedance tune space. A design requirement may be to have enough diode and capacitor combinations for the capacitance range to achieve a suitable resolution when sequencing between each diode and capacitor pair. Referring again to FIG. 1, when $V_{SWT1}$ is forward biased and $V_{SWT2}$ is reverse biased, only the capacitance $C_{n1}$ is connected. If $V_{SWT2}$ is changed from being reverse biased to being forward biased, the combination of $C_{n1}$, $C_{n2}$ are connected. In this case, the difference between $C_{n1}$ and $C_{n2}$ is the effective resolution of the circuit. To achieve a lower resolution, more PIN diodes/FETs and corresponding capacitors must be integrated into the impedance matching circuit.

PIN diodes and FETs allow for fast switching between changes in capacitance. PIN diodes and FETs can be switched at a faster rate than a conventional impedance matching circuits having electromechanical variable capacitors. Capacitances of electromechanical variable capacitors are changed via stepper motors, which incrementally change the capacitances in a linear manner. Capacitance changes with PIN diodes and FETs allow for capacitance ranges (or multiple incremental capacitance steps) to be skipped, whereas electromechanical variable capacitors need to incrementally switch through a series of capacitances to arrive at a desired capacitance. For a conventional impedance matching circuit including electromechanical variable capacitors, an example resolution is less than 0.2 pico-farads (pF) per adjacent (or stepped) capacitance switching transitions.

FIGS. 2A and 2B show differences in impedance tuning spaces for two arrays of PIN diode switches, which convey a practical tuning limitation using PIN diode switches. FIG. 2A shows a Smith chart of an impedance tuning space for a bias matching network having a first array of PIN diodes. FIG. 2B shows a Smith chart of another impedance tuning space for a bias matching network having a second array of PIN diodes. For FIG. 2A, a load capacitor C1 and a tune capacitor C2 of an impedance matching circuit include respective sets of diode and capacitor combinations, where each of the sets includes 24 diode and capacitor combinations to provide 24×24 arrays. Due to different predetermined capacitance ranges for C1 and C2, the effective resolutions of C1 and C2 may be respectively 24 pF per adjacent capacitance switching transition and 56 pF per adjacent capacitance switching transition. In view of the Smith chart of FIG. 2A, large sparse regions can be seen between changes in capacitances for the makeup of this 24×24 array. C2 has a larger resolution than C1. To improve the resolution of C2, the array associated with C2 may be scaled from 24 diode switches to 96 diodes switches. The revised impedance tuning space is shown in the Smith Chart of FIG. 2B. With the increased number of diodes, the resolution is reduced to 14 pF per adjacent capacitance switching transition. Although a reduction in resolution is provided, this is not sufficient to satisfy certain reflected power requirements. A consequence of poor capacitor resolution is lower impedance tuning performance, and an industry standard to meet 0.25% of reflected power remains a challenge with the use of PIN diode/switches.

Voltage and current stress limitations are associated with a PIN diode circuit (e.g., the dual-PIN diode circuit of FIG. 1) having PIN diodes in series with capacitors. The number of capacitors can be increased for current sharing, which results in more capacitors per PIN diode/switch. To manage the voltage stress, PIN diodes with higher voltage ratings can be used and have increased cost. Also, for the load capacitor C1, with 24 diode switch positions and properly shared current, 92 capacitors are required. For the tune capacitor C2, with 96 diode switch positions and properly shared current, 960 capacitors are required. Thus, there is substantial number of components and associated cost with using PIN diode circuits. In addition, PIN diode circuits are limited in ability to meet targeted tuning impedance performance.

SUMMARY

An electronic variable capacitance is provided including a coarse tuning network and a fine tuning network. The coarse tuning network includes a switchable circuit configured to (i) receive a RF input signal from a RF generator of a plasma processing system, (ii) output a first RF output signal to a reference terminal or to a load, and (iii) receive a first direct current (DC) bias voltage. The switchable circuit is configured to be switched between a first state and a second state. A capacitance of the switchable circuit is based on the first DC bias voltage while in the first state and is not based on the first DC bias voltage while in the second state. The fine tuning network is connected in parallel with the coarse tuning network, the fine tuning network comprises a back-to-back diode varactor. The back-to-back diode varactor is configured to receive a second DC bias voltage. The back-to-back diode varactor includes a first diode configured to receive the RF input signal, and a second diode connected in a back-to-back configuration with the first diode and configured to output a second RF output signal to the reference terminal or to the load. A capacitance of the back-to-back diode varactor is based on the second DC bias voltage.

In other features, a method of operating an electronic variable capacitance is provided, wherein the first electronic variable capacitance includes a hybrid tuning network including a coarse tuning network and a fine tuning network. The fine tuning network is connected in parallel with the coarse tuning network. The method includes: receiving a first RF input signal from a RF generator of a plasma processing system at a switchable circuit of the coarse tuning network. The switchable circuit is configured to be switched between a first state and a second state. The method further includes: outputting a first RF output signal from the switchable circuit to a reference terminal or to a load; receiving a first DC bias voltage at the switchable circuit, where a capacitance of the switchable circuit is based on the first DC bias voltage while in the first state and is not based on the first DC bias voltage while in the second state; and receiving a second DC bias voltage at a back-to-back diode varactor of the fine tuning network. The method further includes: receiving the first RF input signal at a first diode of the back-to-back diode varactor; and outputting a second RF output signal from a second diode to the reference terminal or to the load, where the second diode is connected in a back-to-back configuration with the first diode, and where a capacitance of the back-to-back diode varactor is based on the second DC bias voltage.

In other features, a method is provided and includes: determining a distortion quantity, wherein the distortion quantity is an indication of an amount of reflected power provided from a RF generator to a plasma processing chamber; and based on the distortion quantity, determining a gain value for an electronic variable capacitance, wherein the electronic variable capacitance is a shunt capacitance or a series capacitance of an impedance matching network connected between the RF generator and the plasma processing chamber. The electronic variable capacitance comprises a switchable circuit and a varactor. The varactor is connected in parallel with the switchable circuit. The method further includes, during a direct convergence mode: adjusting a first DC bias voltage from an initial DC bias voltage directly to a first target voltage; and supplying the first target voltage to the switchable circuit or the varactor.

In other features, a controller is provided that includes an adjustment module, a control circuit, and a bias circuit. The adjustment module is configured to determine a distortion quantity corresponding to a transfer of RF power from a RF generator to an impedance matching network of a plasma processing system. The control circuit is configured to (i) generate a control signal based on the distortion quantity, and (ii) output the control signal to a driver circuit to provide a first DC bias voltage to and set a capacitance of a switchable circuit of a hybrid tuning network in the impedance matching network. The bias circuit is configured to (i) generate a second DC bias voltage based on the distortion quantity, and (ii) output the second DC bias voltage to a varactor of the hybrid tuning network. The adjustment module is configured to: receive a first feedback signal based on a condition of the switchable circuit; receive a second feedback signal based on a condition of the varactor; adjust the control signal based on the first feedback signal; and adjust the second DC bias voltage based on the second feedback signal.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

The present disclosure will become more fully understood from the detailed description and the accompanying drawings, wherein.

DESCRIPTION

In the following description, numerical designators may be used to refer to the same circuit element, component, module, etc. in different figures. For example, the numerical designator '150' of FIG. 6 refers to the same impedance matching network '150' of FIG. 5. Also, in the following description, alpha-numeric designators may not be used to refer to the same circuit elements in different figures. For example, an alpha-numeric designator 'C1' in FIG. 8A refers to a different capacitor than the alpha-numeric designator 'C1' in FIG. 12.

Figure 1:
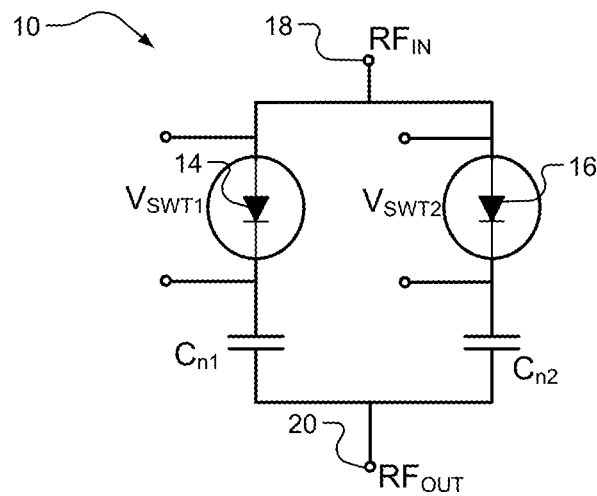
FIG. 1 is a schematic diagram of a traditional dual pin diode circuit of an impedance matching circuit.
Figure 3:
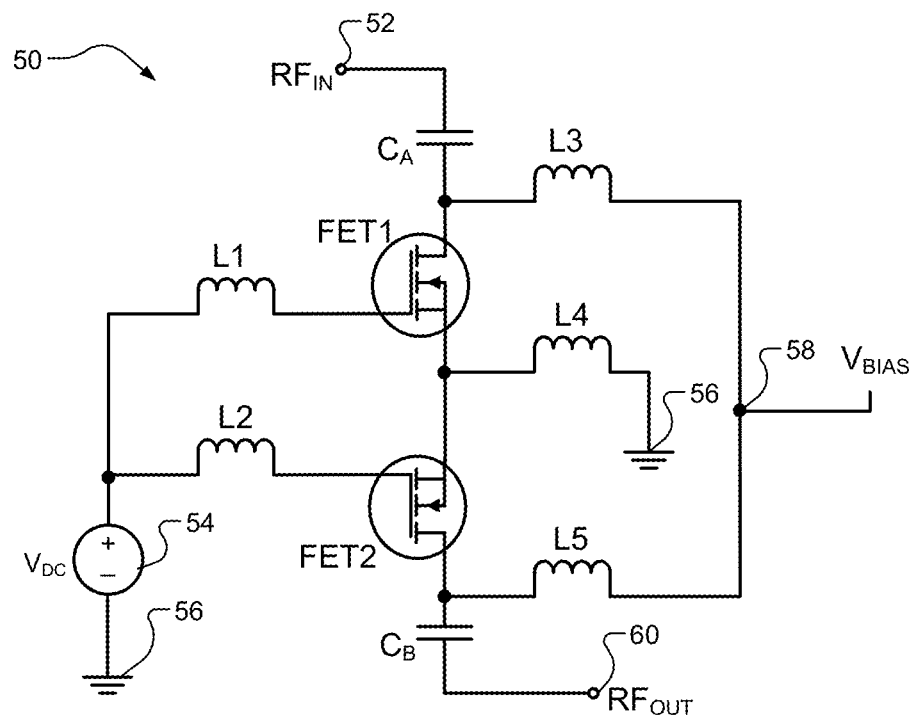
FIG. 3 is a schematic diagram of a field effect transistor (FET) switched capacitance circuit.
Figure 2B:
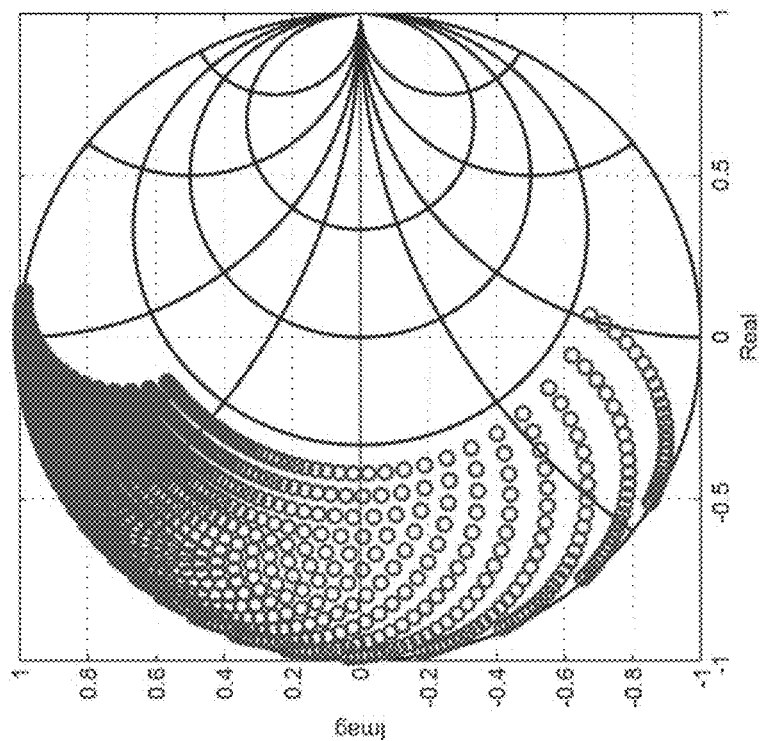
FIG. 2B is a Smith chart of another impedance tuning space for a bias matching network having a second array of PIN diodes.
Figure 2A:
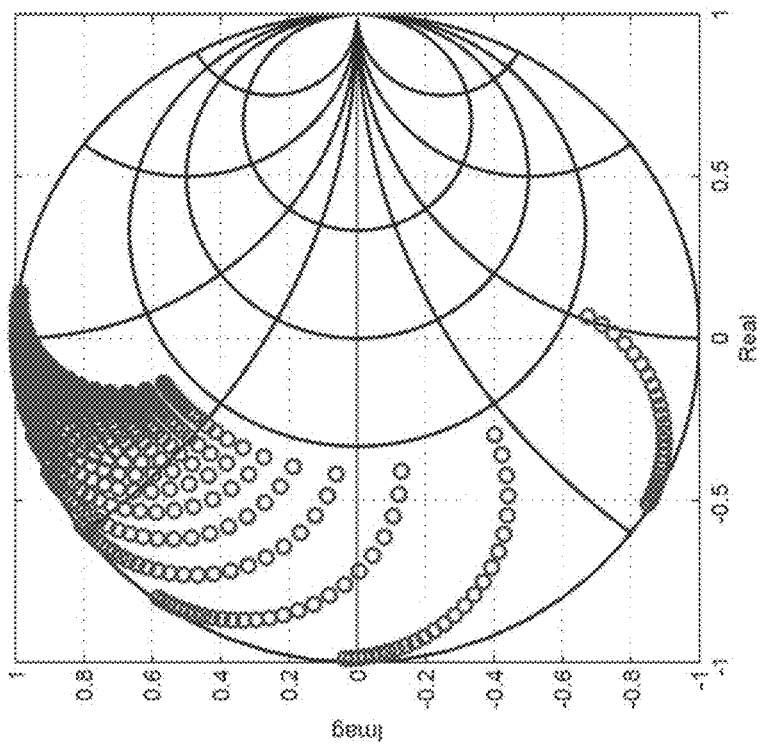
FIG. 2A is a Smith chart of an impedance tuning space for a bias matching network having a first array of PIN diodes.

FIG. 3 shows a FET switched capacitance circuit 50 that includes a first field effect transistor FET1, a second field effect transistor FET2, capacitors $C_A$, $C_B$, and inductors L1-L5. The FET switched capacitance circuit 50 may be included as part of a load capacitor or a tune capacitor of an impedance matching network. A drain terminal of FET1 is connected to (i) an RF input terminal 52 via $C_A$, and (ii) L3. Source terminals of FET1, FET2 are connected to each other. A gate terminal of FET1 is connected to L1, which receives a direct current (DC) control voltage $V_{DC}$ from a voltage source 54. The source terminals of FET1, FET2 are connected to L4, which is connected to a reference terminal (or ground) 56. The voltage source 54 is connected to the reference terminal 56. A gate terminal of FET2 is connected to L2, which receives the DC control voltage $V_{DC}$ from the voltage source 54. A drain terminal of FET2 is connected to L5. L3 and L5 are connected to a bias terminal 58, which receives a DC bias voltage $V_{BIAS}$. The drain terminal of FET2 is also connected to an RF output terminal 60 via $C_B$.

The DC bias voltage $V_{BIAS}$ is applied across each of FET1, FET 2 from the drains to the sources of FET1, FET2. Depending on the DC control voltage $V_{DC}$ and the ON/OFF states of FET1, FET2, the DC bias voltage $V_{BIAS}$ corresponds to one of two voltage levels. When the gates are driven OFF, the DC bias voltage $V_{BIAS}$ is high. As an example, the DC bias voltage $V_{BIAS}$ may be within a predetermined range of 600 VDC. This provides the benefit of a lower capacitance value associated with an OFF FET. When the FET pair (or FET1 and FET 2) are conducting (referred to as 'conducting mode'), the DC bias voltage $V_{BIAS}$ is driven toward 0 VDC. The capacitors $C_A$, $C_B$ are connected between terminals 52, 60 independent of whether FET1, FET2 are ON. The capacitance, when FET1, FET2 are ON, is provided by the capacitances of $C_A$, $C_B$. The capacitance, when FET1, FET2 are OFF, is provided by the capacitances $C_A$, $C_B$ and capacitances of FET1, FET2, which are connected in series. The capacitances of FET1, FET2 are collectively referred to as output source-to-substrate capacitance $C_{OSS}$, which is based on the DC bias voltage $V_{BIAS}$. The DC bias voltage $V_{BIAS}$ is greater than 0 VDC.

To provide a range of possible capacitances for the load capacitance or the tune capacitance of an impedance matching network, a switchable tuning network can be provided including multiple versions of the FET switched capacitance circuit 50. The FET switched capacitance circuit 50 is constructed for a parallel combination of FET pairs. The RF input and RF output terminals of the versions may be connected, such that the FET pairs and corresponding capacitances $C_A$, $C_B$ are connected in parallel. Each of the FET pairs receives a respective DC bias voltage. In FIG. 3, FET1, FET2 are referred to as a FET pair. A switchable tuning network may include multiple versions of the FET switched capacitance circuit including FET pairs and corresponding capacitors $C_A$, $C_B$. Each of the FET switched capacitance circuits provides a predetermined and respective capacitance range. Below Table 1 provides examples of measured capacitances for each of five FET switched capacitance circuits.

TABLE 1

Examples of Capacitance Values of FET Pairs of a FET switched capacitance circuit.

| FET Pair | Off State Capacitance (pF) Across RF Terminals | ON state Capacitance (pF) Across RF Terminals |
| --- | --- | --- |
| 1 | 102.9 | 672.2 |
| 2 | 81.5 | 572.0 |
| 3 | 70.4 | 260.7 |
| 4 | 68.4 | 141.5 |
| 5 | 42.7 | 67.6 |

Figure 4:
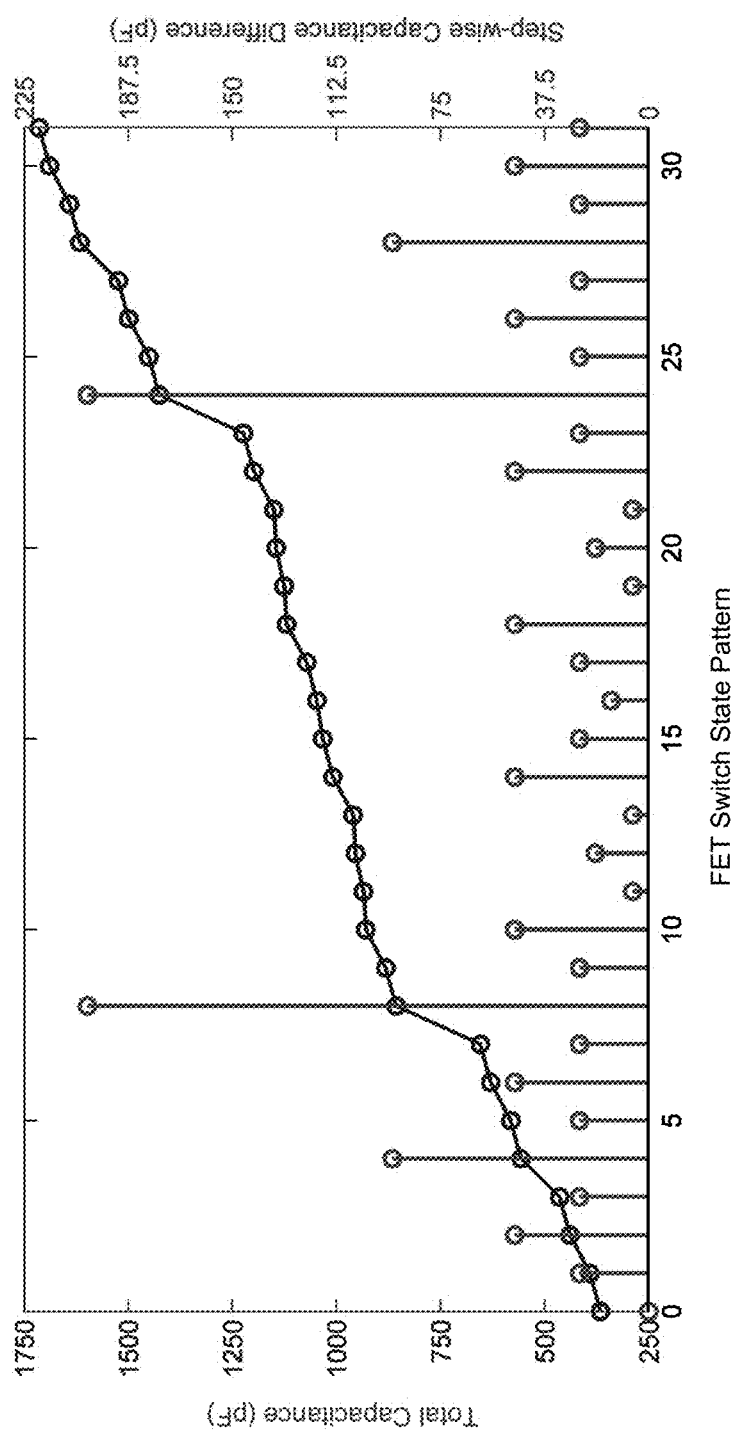
FIG. 4 is a plot of total capacitances and capacitance differences for a switchable tuning network transitioning between FET switch states.
Figure 12:
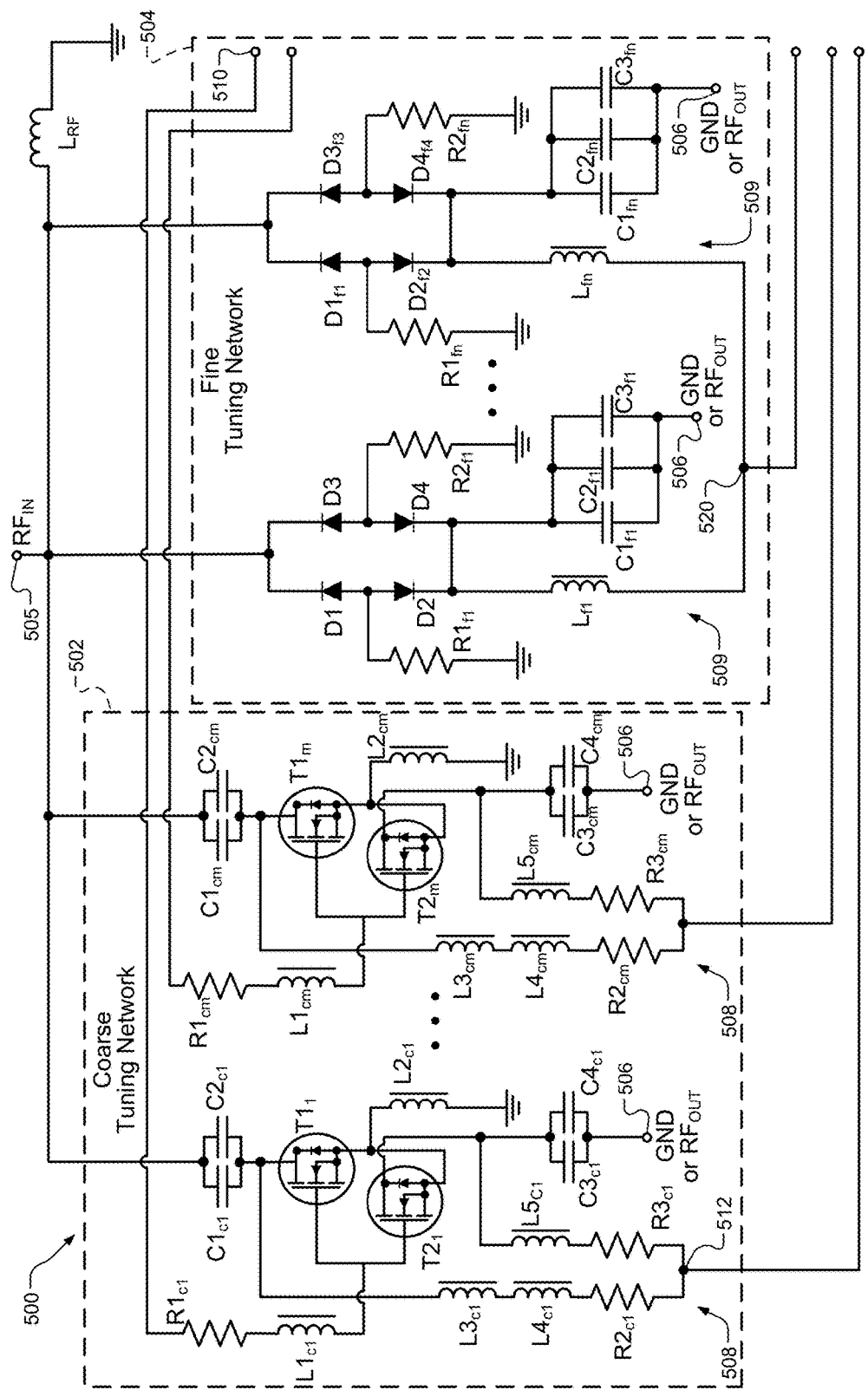
FIG. 12 is a schematic view of a hybrid tuning network with a coarse tuning network and a fine tuning network in accordance with an embodiment of the present disclosure.

FIG. 4 shows a plot of total capacitance values and capacitance differences for the switchable tuning network associated with Table 1. The switchable tuning network was switched through a sequence of FET pair ON/OFF states. The sequence yielded the ascending range of total capacitance values of FIG. 4. The second y-axis shows a difference in capacitance for each sequential change in capacitance. In sequential change in capacitance is associated with changing one or more states of one or more switches in the switchable tuning network. Although the plot shows four noticeable peaks in the capacitance difference, on average, the capacitance difference is less than 50 pF. By adjusting capacitors $C_A$, $C_B$, the peaks can be reduced. This is because each of the peaks is associated with one particular FET switch pair. The peaks may not be able to be fully reduced. This is because the capacitor differences may be more than can be accounted for by varying one or more bias voltages provided to the FET pairs. As a result, the FET switched capacitance circuits have an inherent resolution limitation. To further reduce the peaks and to provide fine tuning, one or more varactor circuits may be connected in parallel to the switchable tuning network. This is further shown and described below. An example of a hybrid tuning network including a switchable tuning network connected in parallel with one or more varactors is shown in FIG. 12.

Figure 18:
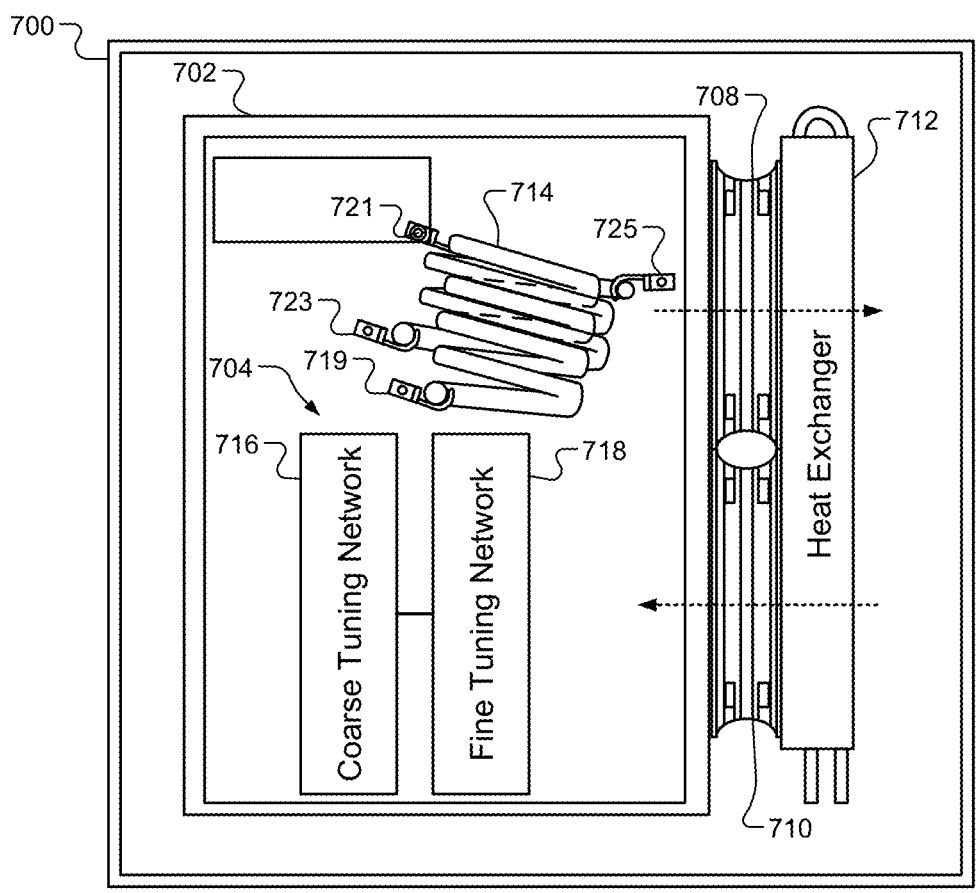
FIG. 18 is a view of a dual enclosure including a hybrid tuning network in accordance with an embodiment of the present disclosure.

Hybrid tuning networks are disclosed herein and may include solid-state variable capacitors, where each of the solid-state variable capacitors includes a network of FET switches connected in parallel with one or more varactors. Each of the varactors includes a network of diodes that are biased to vary a net capacitance of the hybrid tuning networks. The network of FET switches provides coarse tuning capability. The varactors provide fine tuning capability. The coarse and fine tuning capabilities provide improved tuning operation relative to prior art implementations. Additional features include improved switching rates at increased bias voltages to achieve a wide capacitance range and resolution. Also, to reduce voltage stress, the solid-state variable capacitors may be coupled to an air-core transformer. An example of this is shown in FIG. 18. The combination of the solid-state variable capacitors and the air-core transformer enables a complete electronic controlled match of an impedance matching network. In addition, the impedance matching network and/or portions thereof may be packaging in a sealed enclosure, which prevents an air exchange that can degrade the impedance matching network and/or environment. The environment may refer to an area within a facility where air cleanliness is of high-importance for high-volume manufacturing.

Figure 5:
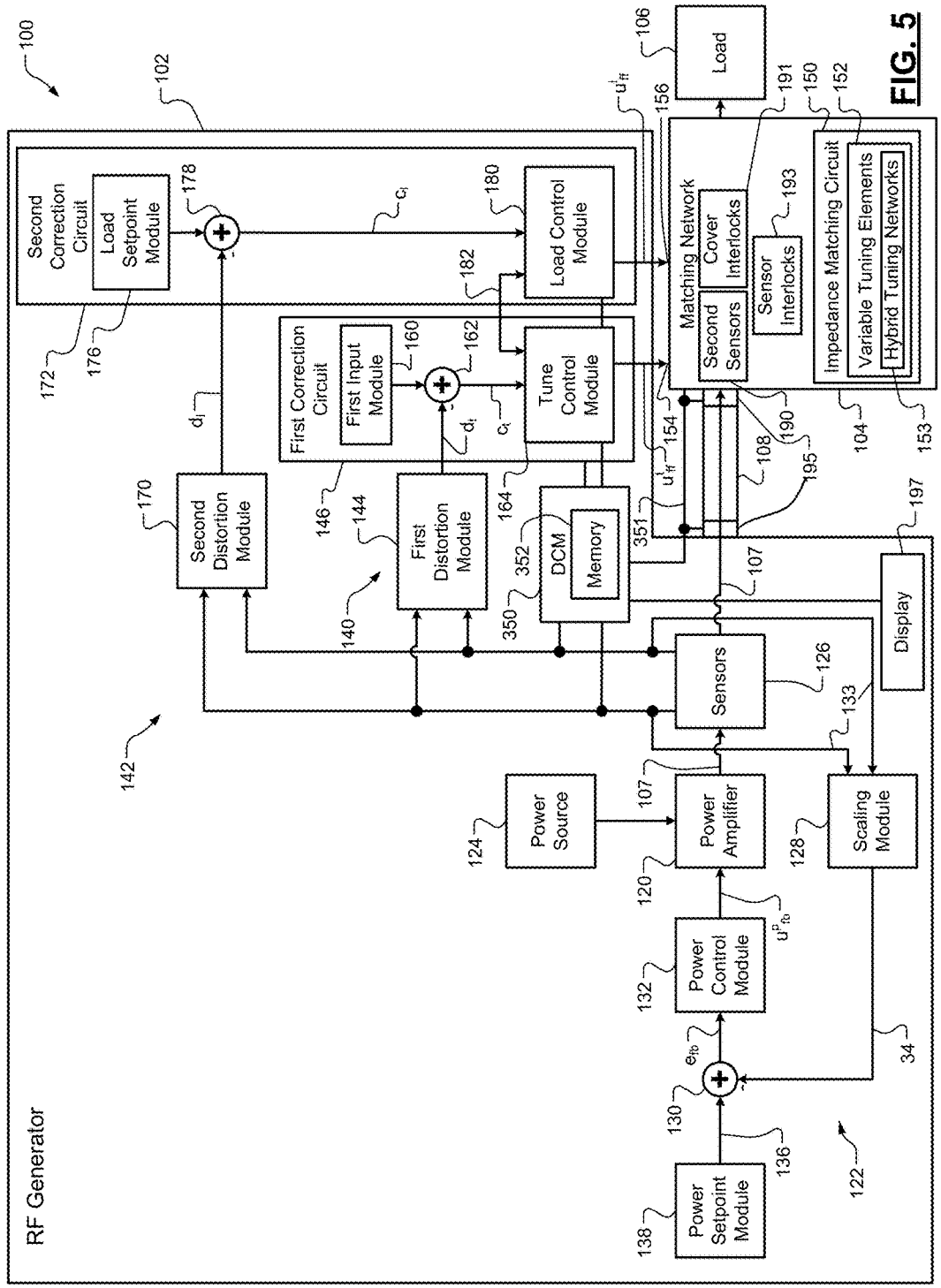
FIG. 5 is a functional block diagram of a RF power system incorporating feedforward control in accordance with the present disclosure.

FIG. 5 shows a RF power system 100 that includes a RF generator 102, a matching network 104 (referred to also herein as an "impedance matching network"), and a load 106 of the matching network 104. The RF generator 102 generates a RF power signal 107, which is provided to the matching network 104. The matching network 104 matches an input impedance of the matching network 104 to a characteristic impedance of a transmission line 108 between the RF generator 102 and the matching network 104. Put another way, the matching network 104 matches an impedance of the load 106 to an impedance as seen by the output of the RF generator 102. The matching network 104 and the load 106 may be considered as the load on the RF generator 102. The load 106 may be, for example, a plasma chamber or other RF load. The impedance of the load 106 may be static (i.e. unchanging over time) or dynamic (i.e. changing over time).

The RF generator 102 includes a RF power source 120 (or a power amplifier) and a feedback loop 122. The power amplifier 120 generates the RF power signal 107, which is outputted to the matching network 104. The power amplifier 120 may generate the RF power signal 107 based on a power signal received from a power source 124 external to the power amplifier 120. Although the power source 124 is shown as part of the RF generator 102, the power source 124 may be external to the RF generator 102. The power source 124 may be, for example, a direct current (DC) power source.

The feedback loop 122 includes one or more sensors (first sensors) 126, a scaling module 128, a first summer 130, and a power control module 132. The sensors 126 may include voltage, current and/or directional coupler sensors. The sensors 126 may detect (i) voltage V and current I output of the power amplifier 120, and/or (ii) forward (or source) power $P_{FWD}$ out of the power amplifier 120 and/or RF generator 102 and reverse (or reflected) power $P_{REV}$ received from the matching network 104. The voltage V, current I, forward power $P_{FWD}$, and reverse power $P_{REV}$ may be scaled and/or filtered versions of the actual voltage, current, forward power and reverse power of the output of the power amplifier 120. The sensors 126 may be analog and/or digital sensors. In a digital implementation, the sensors 126 may include analog-to-digital (A/D) converters and signal sampling components with corresponding sampling rates.

The sensors 126 generate sensor signals 133, which are received by the scaling module 128. The scaling module 128 scales the sensor signals 133 and generates a power feedback signal 134. The power feedback signal 134 is generated based on the sensor signals 133 and a scaling matrix. The power feedback signal 134 may represent the forward power for forward power leveling deliver power. The power feedback signal 134 may represent the RF power transferred to the matching network 104 or load power $P_d$ and can be represented by equation 1, where V is voltage output of the power amplifier 120 and/or RF generator 102, I is current out of the power amplifier 120 and/or RF generator 102, and Θ is a phase difference between the voltage and the current outputs V, I of the power amplifier 120.

$$P_d = |V||I|\cos(\Theta) = P_{FWD} - P_{REV} \quad (1)$$

The first summer 130 sums the power feedback signal 134 with a predetermined power setpoint signal 136, which may be generated by a power setpoint module 138. The power feedback signal 134 may be subtracted from the predetermined power setpoint signal 136 to generate an error signal $e_{fb}$.

The power control module 132 receives the error signal $e_{fb}$ and generates a power control signal $u^p_{fb}$ to regulate power out of the power amplifier 120. The power control signal $u^p_{fb}$ is provided to the power amplifier 120. The power amplifier 120 adjusts the RF power signal 107 based on the power control signal $u^p_{fb}$. The RF power signal 107 may be a continuous waveform or a pulsed waveform. The servo control described herein allows for the RF power signal 107 to be pulsed due to the update rate associated with the servo control. The power control module 132 may include a proportional integral derivative (PID) controller and/or a direct digital synthesis (DDS) component(s). In one implementation, the power control module 132 is a first PID controller with a function identified as $D^p_{fb}(z)$. The power control signal $u^p_{fb}$ may be a drive signal and have a DC offset or rail voltage, a frequency and a phase. However, the power control signal $u^p_{fb}$ does not adjust frequency of the RF power signal 107.

The RF generator 102 may further include a first feedforward loop 140 and a second feedforward loop 142. The first feedforward loop 140 includes a first distortion module 144 and a first correction circuit 146. The first distortion module 44 determines a distortion value $d_t$ representative of the distortion as seen at the output of the power amplifier 120 and/or RF generator 102. The distortion values described herein may be used during the hybrid tuning control method of FIG. 21. The first distortion value $d_t$ is generated based on the sensor signals 133 and a distortion function. The distortion function is described in more detail below. The first correction circuit 146 generates a first power tuning value (or first impedance tuning value) $u^t_{ff}$ based on the first distortion value $d_t$. The tuning value $u^t_{ff}$ is provided to the matching network 104 for frequency response tuning and impedance adjusting purposes. The first distortion module 144 may determine the first distortion value $d_t$ based on a sinusoidal function and/or a cross-correlation function.

Multiple techniques are disclosed herein that include maximizing optimal power transfer in an RF power system with a dynamic load (i.e. a load having varying impedance(s)). A first technique, which is described with respect to FIG. 5 includes the RF power source 124 connected to the matching network 104. The matching network 104 may include an impedance matching network 150 with one or more variable tuning elements 152 (e.g., variable capacitors). Each of the variable tuning elements may include a hybrid tuning network 153. The variable tuning elements 152 may be in a 'L'-configuration (one capacitance in parallel with the RF generator 102 and one capacitance in series with the load 106) or in other configurations as shown below in FIGS. 14 and 17.

The variable tuning elements 152 are used for adjusting tune and load parameters of the matching network 104, and may have respectively an associated tune input 154 and load input 156. The tune and load parameters refer to impedance adjustments perforated in the matching network 104 via the variable tuning elements 152. As an example, the tune parameter and the load parameter may be associated with respective capacitances of capacitors in the matching network 104.

Figure 6:
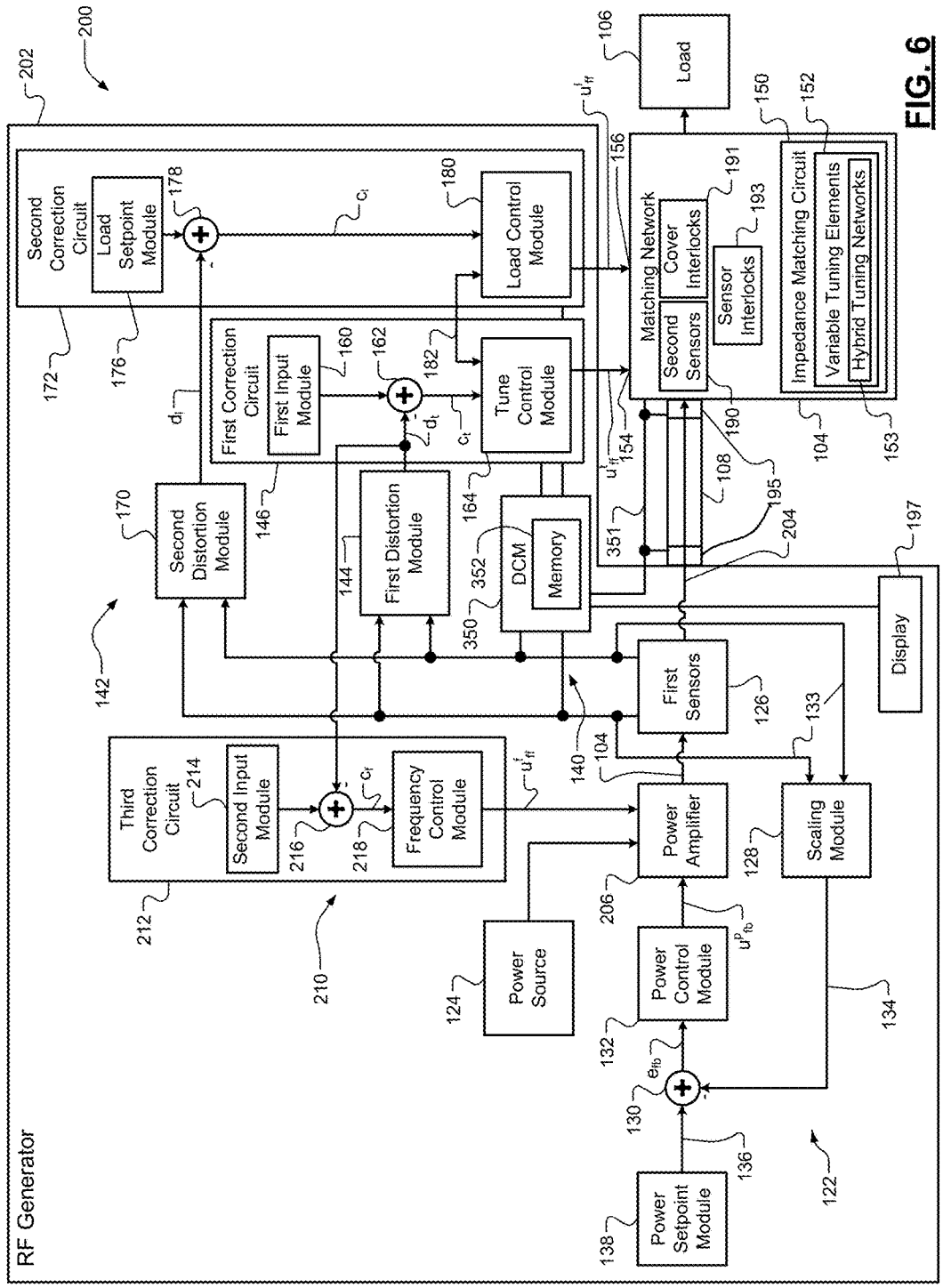
FIG. 6 is a functional block diagram of a RF power system incorporating feedforward control and power correction feedback control in accordance with the present disclosure.

A second technique, which is described with respect to FIG. 6, introduces a variable frequency adjustment to the power amplifier 120 and may be used alternatively or in combination with the first technique. The tune and load parameters may each be fixed, discretely selectable, and/or adjustable when using the second technique.

In both the first and second techniques, the RF power transferred $P_d$ from the power amplifier 120 to the matching network 104 is maximized. This may occur when the forward power $P_{FWD}$ to the matching network 104 is maximized and/or the reverse power $P_{REV}$ from the matching network is minimized. The first distortion value $d_t$ is determined via the first distortion module 144 using vector calculus without determining the phase Θ. The first distortion value $d_t$ may be equal to and/or be represented by a sinusoidal function.

The techniques disclosed herein enable autonomous servo of an agile frequency RF power source (power amplifier 120) for maximized power transfer. Although servo control includes feedback and feedforward control, the feedforward control provided herein aids in quickly maximizing the power transferred to the matching network 104. These techniques include determining distortion of a RF power system (RF power system 110) and providing feedforward correction using vector calculus. The distortion refers to the reflected power due to the reactive change in load impedance, which is directly related to the sinusoidal function of the phase $\Theta$. As an alternative to and/or in addition to using a sinusoidal function, a cross-correlation function may be used to determine the first distortion value $d_t$. The first distortion module 144 may determine the first distortion value $d_t$.

Referring again to FIG. 5, in one implementation, the first correction circuit 146 includes a first input module 160, a second summer 162 and a tune control module 164 (or $D^t_{ff}(z)$). The first input module 160 may generate a first predetermined value (e.g., 0 when determining the distortion value $d_t$ according to the sine function or 1 when determining the distortion value $d_t$ according to the cosine function). The second summer 162 may subtract the first distortion value $d_t$ from the first predetermined value to generate a tuning or first correction value $c_t$. The time control module 164 may include a second PID controller and generate a power tuning value (or first impedance tuning value) $u^t_{ff}$ based on the first correction value $c_t$. The tune control module 64 may adjust the power tuning value $u^t_{ff}$ to match the first distortion value $d_t$ with the first predetermined value. The tune control module 164 may generate and/or receive the first predetermined value.

The second feedforward loop 142 may include a second distortion module 170 and a second correction circuit 172. The second distortion module 170 determines a ratio of magnitudes (or second distortion value) $d_l$ based on the sensor signals 133 and a second distortion function. The first and second distortion values $d_t$, $d_l$ each provide an indication of distortion and/or associated parameters, as measured by the sensors 33.

The second correction circuit 172 may include a load setpoint module 176, a third summer 178 and a load control module 180, which may be represented as a function $D^l_{ff}(z)$. The load setpoint module 176 may generate a predetermined load setpoint value (e.g., 50 Ohms ($\Omega$)). The third summer 178 may subtract the second distortion value $d_l$ from the load setpoint value to generate a load correction value (second correction value) $c_l$.

The load control module 180 may include a third PID controller and may generate a power load value (or second impedance tuning value) $u^l_{ff}$ based on the second correction value $c_l$. The load control module 180 may adjust the power load value $u^l_{ff}$ to match the second distortion value $d_l$ to the load setpoint value. The load control module 180 may generate and/or receive the load setpoint value.

The tune control module 164 and the load control module 180 are coupled, as represented by arrow 182. The arrow 182 represents a mutual coupling between the tune and the load inputs 154, 156 of the matching network 104. The power load value $u^l_{ff}$ is affected (or indirectly adjusted) when the power tune value $u^t_{ff}$ is directly adjusted by the tune control module 164. Similarly, the power tune value $u^t_{ff}$ is affected (or indirectly adjusted) when the power load value $u^l_{ff}$ is directly adjusted by the load control module 180. The tune and load inputs 154, 156 are adjusted respectively by the power tune value $u^t_{ff}$ and the power load value $u^l_{ff}$.

The matching network 104 may also include second sensors 190. The second sensors 190 may include phase and magnitude sensors, which are used by the impedance matching network 150 to adjust the tune and load inputs 154, 156. The impedance matching network 150 may adjust the tune and load inputs 154, 156 such that the load 106 and the matching network 104 have an impedance as seen by the power amplifier 120 and/or the RF generator 102 matching the impedance of the transmission line 108. The tune and load inputs 154, 156 may be adjusted until phase of the RF power signal 107 is 0 and impedance of the matching network 104 is at a predetermined impedance (e.g., 50$\Omega$). This aids in minimizing the reverse power $P_{REV}$, which maximizes power transferred to the matching network 104. The second sensors 190 may be electrically coupled to the transmission line 108 and used to detect the distortion (or $P_{REV}$) of the RF power system 100. The tune and load adjustments performed by the impedance matching network 150 based on the outputs of the second sensors 190 do not need to fully maximize the power transferred, as the feedforward loops 140, 142 further aid in maximizing the power transferred.

The second sensors 190 may be located at an input of the matching network 104, not at an output of the matching network 104 to quantify the distortion of the RF power system 10 as a function of the reverse power $P_{REV}$. The matching network 104 may apply a feedforward match correction $u^m_{ff}$ to correct an impedance mismatch between the matching network 104 and the transmission line 108. Collective power transfer contributions by the power control module 132 and the matching network 104 (and/or controller of the matching network 104) to power delivery may be analytically represented as a sum of the correction values provided by these controllers. This sum is provided by equation 2, where u is the total distortion correction.

$$u = u^p_{fb} + u^m_{ff} \quad (2)$$

The tune and load control modules 164, 180 provide the distortion corrections values $u^t_{ff}$ and $u^l_{ff}$, which are provided to the tune and load inputs 154, 156. The match correction value $u^m_{ff}$ may be expressed as a sum of these correction values, as represented by equation 3.

$$u^m_{ff} = u^t_{ff} + u^l_{ff} \quad (3)$$

Without the distortion correction of the matching network 104, there can be a loss in the RF power system 100 if feedback control is used without feedforward control. The second sensors 190 may be coupled to the transmission line 108 to measure the reverse power $P_{REV}$. The matching network 104 may not correct all of the distortion, as other feedforward control is provided via the feedforward loops 140, 142. The matching network 104 may adjust the tune and load inputs 154, 156 based on the reverse power $P_{REV}$. The distortion correction as performed by the matching network 104 may be limited and may not reduce the reverse power $P_{REV}$ to 0 due to model imperfections and/or a measurement error. The feedforward correction provided by the feedforward loops 140, 142 may further correct the distortion and reduce the reverse power $P_{REV}$ to 0.

FIG. 6 shows a RF power system 200 that includes a RF generator 202, the matching network 104 with the impedance matching network 150 and the second sensors 190, and the load 106. The RF generator 202 generates a RF power signal 204, which is provided to the impedance matching network 150. The RF generator 202 includes a RF power source (or a power amplifier) 206 and the feedback loop 122. The power amplifier 206 generates the RF power signal 204, which is an output to the matching network 104. The power amplifier 206 may generate the RF power signal 204 based on (i) a power signal received from the power source 124 external to the power amplifier 206, and/or (ii) a frequency tuning value $u^f_{ff}$. The power source 124 may be, for example, a direct current (DC) power source.

The feedback loop 122 includes the sensors 126, the scaling module 128, the first summer 130, and the power control module 132. The sensors 126 generate the sensor signals 133, which are received by the scaling module 128. The scaling module 128 scales the sensor signals 133 and generates the power feedback signal 134. The power feedback signal 134 is generated based on the sensor signals 133 and the scaling matrix. The first summer 130 sums the power feedback signal 134 with the predetermined power setpoint signal 136, which may be generated by the power setpoint module 138. The power feedback signal 134 may be subtracted from the predetermined power setpoint signal 136 to generate the error signal $e_{fb}$.

The power control module 132 receives the error signal $e_{fb}$ and generates the power control signal $u^p_{fb}$ to regulate power out of the power amplifier 206. The power amplifier 206 adjusts the RF power signal 204 based on the power control signal $u^p_{fb}$ and the frequency tuning value $u^f_{ff}$. The RF power signal 204 may be a pulsed waveform and have a frequency set based on the frequency tuning value $u^f_{ff}$.

The RF generator 102 may further include the first feedforward loop 140, the second feedforward loop 142, and a third feedforward loop 210. The RF power system 100 may include the third feedforward loop 210 and not the first and second feedforward loops 140, 142 or may include the first, second and third feedforward loops 140, 142, 210, as shown. The first feedforward loop 140 includes the first distortion module 144 and the first correction circuit 146 with the first input module 160, the second summer 162 and the tune control module 164. The second feedforward loop 142 may include the second distortion module 170 and the second correction circuit 172 with the load setpoint module 176, the third summer 178 and the load control module 180.

Although the third feedforward loop 210 is drawn as a feedback loop, the third feedforward loop 210 performs as a feedforward loop and performs a feedforward function and is thus referred to herein as a feedforward loop. The third feedforward loop 210 provides the frequency tuning value $u^f_{ff}$ which is used to adjust frequency of the RF power signal 204. By adjusting the frequency of the RF power signal 204, frequency responses of the matching network 104 changes, which alters impedances in the matching network 104. These impedance changes affect impedance matching between the matching network 104 and the transmission line 108, which affects the amount of reverse power $P_{REV}$ and the amount of power transferred $P_d$.

The third feedforward loop 210 includes the first distortion module 44 and a third correction circuit 212. The third correction circuit 212 includes a second input module 214, a fourth summer 216 and a frequency control module 218, which may be represented as a function $D^f_{ff}(z)$. The second input module 214 generates a third predetermined value (e.g., 1). The fourth summer 216 may subtract the distortion tuning value $d_t$ from the third predetermined value to generate a third correction value $c_f$. The frequency control module 218 may include a fourth PID controller and generate the frequency tuning value $u^f_{ff}$ based on the third correction value $c_f$. The frequency control module 218 may adjust the frequency tuning value $u^f_{ff}$ to match the first distortion value $d_t$ to the third predetermined value. The frequency control module 218 may generate and/or receive the third predetermined value.

Figure 7:
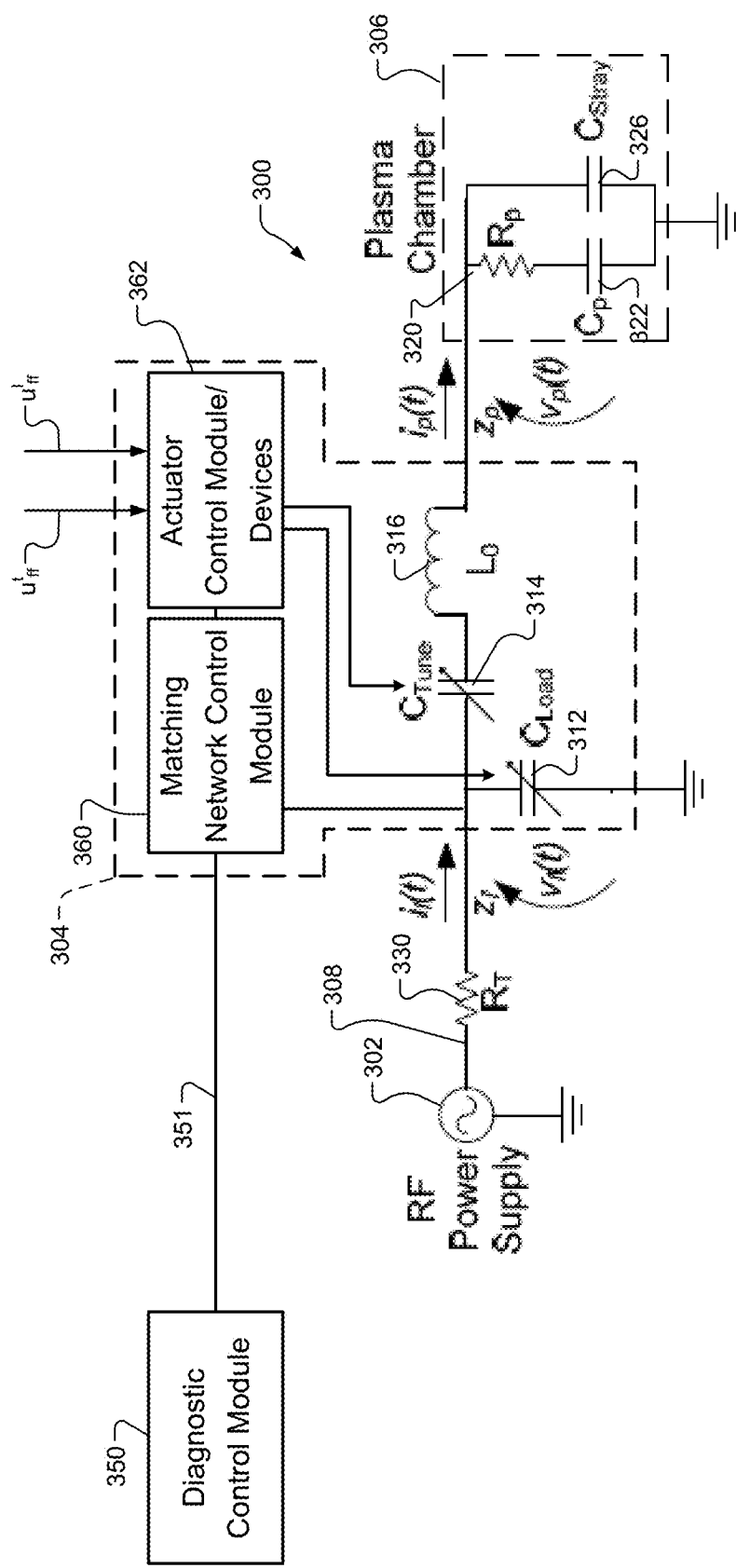
FIG. 7 is a schematic diagram of a model of a RF plasma system.

FIG. 7 shows a generalized model of a plasma system 300. The plasma system 300 includes a RF power supply 302, a matching network 304, and a plasma chamber 306. The RF power supply 302 generates a sinusoidal output signal to plasma chamber 306 via transmission line 308 having a resistance $R_T$ 330 and matching network 304. Circuit components of the matching network 304 may be included in the matching network 104 of FIGS. 5-6. The matching network 304 is modeled as a tunable load capacitor $C_{LOAD}$ 312 shorted to ground, a tunable series capacitor $C_{TUNE}$ 314 in series with transmission line 308 and output inductance $L_O$ 316. The capacitors 312, 314 may be replaced with other variable tuning elements, circuits and/or networks. Current flowing into matching network 304 is shown as $i_t(t)$, voltage circulating through matching network 304 is indicated as $v_t(t)$, and the impedance of matching network 304 is shown as $Z_t$. The plasma chamber 306 is modeled as a real resistive load $R_P$ 320 in series with a reactive element, parasitic capacitance $C_P$ 322. The series combination of resistive load $R_P$ 320 and parasitic capacitance $C_P$ 322 is placed in parallel with reactive stray capacitance $C_{STRAY}$ 326. Current flowing into plasma chamber 306 is shown as $i_P(t)$, voltage circulating through plasma chamber 306 is indicated as $v_P(t)$, and the impedance of plasma chamber 306 is shown as $Z_P$.

The capacitors 312, 314 may each be replaced with, implemented as, and/or include any of the hybrid tuning networks disclosed herein. The capacitances are referred to as electronic variable capacitors (eVCs) because capacitances of the capacitors 312, 314 are electronically controlled. Examples of the hybrid tuning networks are disclosed below. Each of the hybrid tuning networks may be used for both coarse tuning and fine tuning. The coarse and fine tuning may be controlled by the diagnostic control module 350, the actuator control module/devices 362, the tune control module 164 of FIGS. 5-6 and/or the load control module 180 of FIGS. 5-6. The tuning may be performed based on one or more of the herein described distortion signals $d_t$, $d_l$, $d_r$ as further described below.

For remote impedance tuning operation, a communication link 351 between the RF power supply and impedance matching device is provided to communicate desired variability of configurable reactive elements. As an example, the communication link 351 may be connected between the circuits 146, 172 and the matching network 104 and include distortion correction (or actuator command) signals $u^t_{ff}$, $u^l_{ff}$. The communication link may be an analog or digital communication link.

Example circuits and modules controlling impedance tuning are the circuits 146, 172 and the modules 144, 160, 164, 170, 176, 180, which may control impedance tuning based on the distortion quantities disclosed herein. Through a remote impedance controlling interface (e.g., the display 197) device details and performance statistics may be reported.

The feedforward impedance tuning described herein may use the notion of a numerically complex quantity of distortion, $d=d_r+jd_i$. The corresponding actuators are varied until the $\min(d)=\min(d_r)=\min(d_i)$. The update to the impedance tuning actuators are governed by conventional proportional-plus-integral-plus-derivative controllers (PID). The gains for the PID controllers are selected to suitably tune the load impedance of the impedance tuning device without significant overshoot (underdamped) or substantially overdamped performance. Therefore, the gain is chosen for $$G \approx \frac{\partial x}{\partial d}$$

for a particular range corresponding to the change of the actuator command signal, x, to the change in the distortion.

Back-to-Back Diode Varactor

Figure 8A:
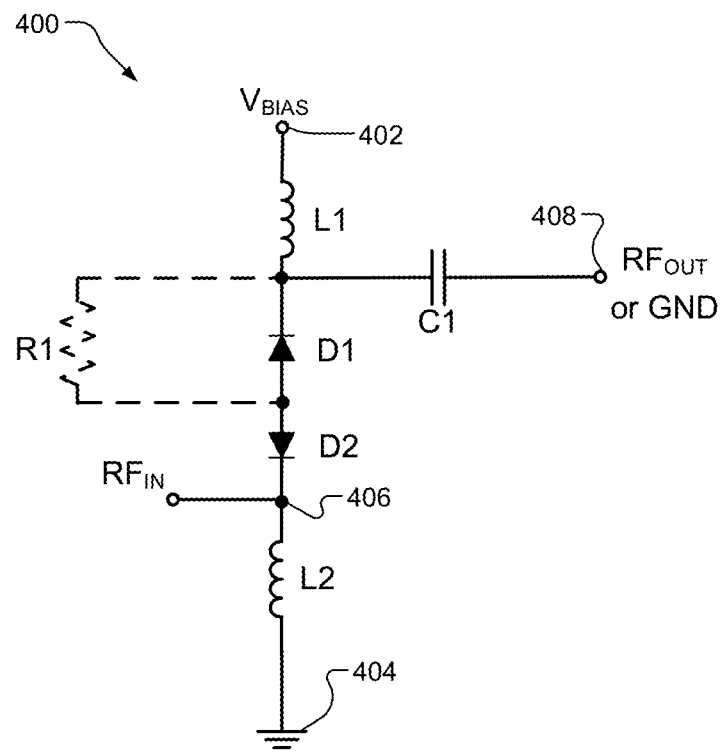
FIG. 8A is a schematic of a back-to-back diode varactor with anode connected diodes in accordance with an embodiment of the present disclosure.

FIG. 8A is a schematic of a back-to-back diode varactor 400 that includes a pair of diodes D1, D2, inductors L1, L2 and capacitor C1. The diodes D1, D2 and inductors L1, L2 are connected in series between a DC bias voltage terminal 402 and a reference terminal (or ground) 404. Anodes of the diodes D1, D2 are connected to each other. An RF input signal is received at a terminal 406 between the diode D2 and the inductor L2. The capacitor C1 is a bypass capacitor that permits passage of RF power and is connected (i) at a first end to the inductor L1 and a cathode of the diode D1, and (ii) at a second end to an RF output terminal or ground terminal 408. The inductors L1, L2 may be referred to as RF chokes because the inductors L1, L2 prevent passage of RF power.

The back-to-back diode varactor 400 of FIG. 8A may be connected in parallel with the FET switched capacitance circuit 50 of FIG. 3. This combination provides an example of a hybrid tuning network that can be used for both coarse tuning and fine tuning. The FET switched capacitance circuit may be used for coarse tuning and the back-to-back diode varactor 400 may be used for fine tuning.

The back-to-back diode varactor 400 is supplied the DC bias voltage $V_{BIAS}$ at the terminal 402, which is used to set a capacitance of the back-to-back diode varactor 400 between the RF input terminal 406 and the RF output or ground terminal 408. This is different than providing a DC bias voltage at a center tap (or anodes) of the diodes D1, D2, where an equal amount of voltage is applied to each of the diodes D1, D2. Upon applying a non-zero positive DC bias voltage $V_{BIAS}$, anode-cathode voltages across each of the diodes D1, D2 reach a charge equilibrium condition. As a result, diode D1 is reverse-biased and diode D2 is slightly forward biased. The forward bias is less than a built-in potential of the diode D2, since reverse-biased diode D1 prevents DC current flow.

The capacitance of a p-type/n-type (PN) junction can be expressed as provided by equation 4, where $\phi$ is the built-in potential of the diode, $V_{BIAS}$ is the applied DC bias voltage, n is a power law exponent of a diode capacitance, and K is the capacitance constant.

$$C(V) = \frac{K}{(\phi + V_{BIAS})^n} \quad (4)$$

Figure 9A:
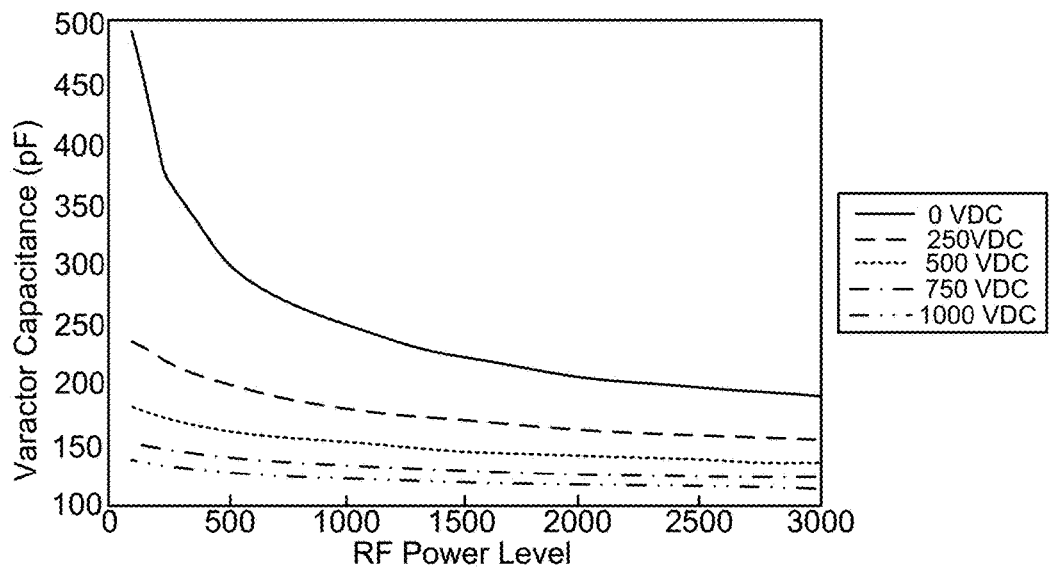
FIG. 9A is a plot of varactor capacitances of the back-to-back diode varactor of FIG. 9 for different radio frequency (RF) power voltages and bias voltages.
Figure 9B:
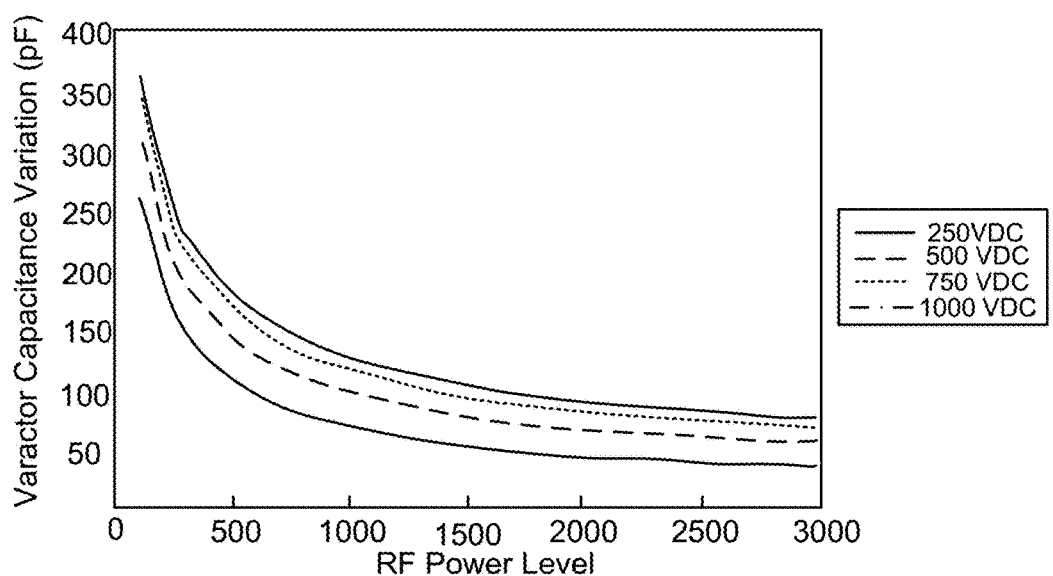
FIG. 9B is a plot of capacitance variations of the back-to-back diode varactor of FIG. 9 for different bias voltages at particular RF power levels.

The power law exponent n is dependent upon the fabrication technique used to manufacture the corresponding diode. For example, a uniformly doped junction has a power law exponent n of 0.5. Example values of the built-in potential $\phi$ are 0.5-01.6V. The capacitance constant K is also known as a zero bias junction capacitance and depends upon diode construction and device area. The capacitance relationship of expression 4 results in a sharply nonlinear capacitance-voltage curve with highest capacitance at a smallest (magnitude) DC bias voltage (examples of this are shown in FIGS. 9A, 9B).

For the back-to-back diode varactor 400, three examples are provided for corresponding DC bias voltages. For the first example, the DC bias voltage is 0V and diodes D1, D2 have capacitance approximately equal to K. This results in a composite capacitance of the diodes D1, D2 in series being K/2. For the second example, the DC bias voltage is 10V, the diode D2 is forward biased slightly less than $\phi$, capacitance of the diodes D2 is equal to K, and the diode D1 is reverse biased by 10-$\phi$ and has a lower capacitance than D2. As a result, the composite capacitance of the diodes D1, D2 is a series combination of the capacitances of diodes D1, D2. For the third example, the DC bias voltage is 500V, the diode D2 is forward biased slightly less than $\phi$, capacitance of the diode D2 is equal to K (or a relatively high capacitance), and the diode D1 is provided with a high-reverse DC bias voltage and thus has a smaller capacitance than the diode D2. The small capacitance of diode D1 dominates the composite capacitance of diodes D1, D2, since the diodes D1, D2 are connected in series.

Figure 10:
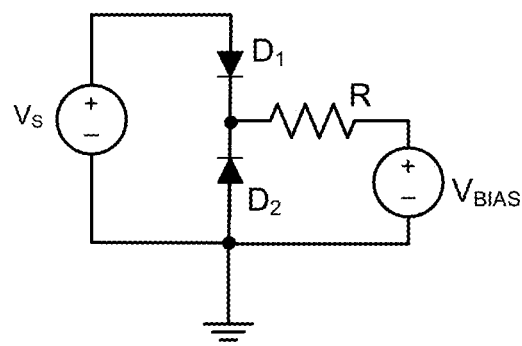
FIG. 10 is a schematic diagram of a traditional varactor having center-tapped voltage bias.

The condition in which one diode is slightly forward biased is different from traditional varactors with center-tapped bias circuits. An example traditional varactor having a center-tapped bias circuit is shown in FIG. 10 in which both diodes are reverse-biased by a DC bias voltage. The varactor tuning circuits disclosed herein operate as a variable capacitor while a DC bias voltage plus a voltage of a RF input signal is less than an Avalanche breakdown voltage (e.g., ±1200V) of the corresponding back-to-back diodes. The traditional varactors with center-tapped bias circuits do not function as a variable capacitor unless the bias voltage of each diode is negative and has an absolute value greater than a peak RF voltage. This is unlike the disclosed varactor tuning circuits, which allow one of the diodes to be forward biased and allows the diodes to be biased with a voltage having an absolute value less than a peak voltage of a received RF input signal.

The disclosed varactor tuning circuits operate as a variable capacitance while one of the diodes is forward biased and the other one of the diodes is reversed biased. Since one of the diodes is reversed biased, a forward bias voltage across the other diode, while the DC bias voltage is greater than 0 and is adjusted in magnitude, remains at a voltage (e.g., 1.2V) less than the built-in potential (e.g., 1.6V) and is prevented from exceeding the built-in potential $\phi$. This allows the disclosed varactor tuning circuits to continue to operate as a variable capacitor for a large range of DC bias voltages. See for example FIG. 11A. Zero-biasing the diodes of the traditional varactors with center-taped bias voltage results in the diodes turning ON due to an RF voltage received and the diodes no longer operating as a variable capacitor. When the diodes of the traditional varactors turn ON, the traditional varactors operate as a rectifier and no longer operate as a variable capacitor. This is unlike the disclosed varactor tuning circuits, which provide peak capacitance when the DC bias voltage across the diodes is 0, see for example FIG. 11C. The diodes of the disclosed varactor tuning circuits are OFF (not forward biased at a voltage greater than the built-in potential $\phi$) when the DC bias voltage is 0. The capacitance of the disclosed varactor tuning circuits decreases as the DC bias voltage increases. As a result, the disclosed varactor tuning circuits operate fundamentally different than traditional varactor circuits with center-taped bias voltages.

If a small RF input voltage (much less than the DC bias voltage) is applied to the back-to-back diode varactor 400, capacitance can be varied from K/2 to a smaller value (with a range of a ratio of a maximum capacitance Cmax of the back-to-back diode varactor 400 to a minimum capacitance Cmin of the back-to-back diode varactor 400 being 3-10x, where x is a predetermined value). When the RF input signal voltage increases (as in a high-power circuit), the diodes D1, D2 may alternately become reverse biased as the RF input signal transitions from a positive peak to a negative peak. The net effect of this situation reduces a tuning range of the back-to-back diode varactor 400. This effect can be reduced by adding diode pairs in series with the existing diodes D1, D2, but this reduces the capacitance of the back-to-back diode varactor 400 and increases cost/complexity. The hybrid tuning circuits described with respect to, for example, FIGS. 12, 14, 17 and 21-22 overcome these problems.

Figure 11A:
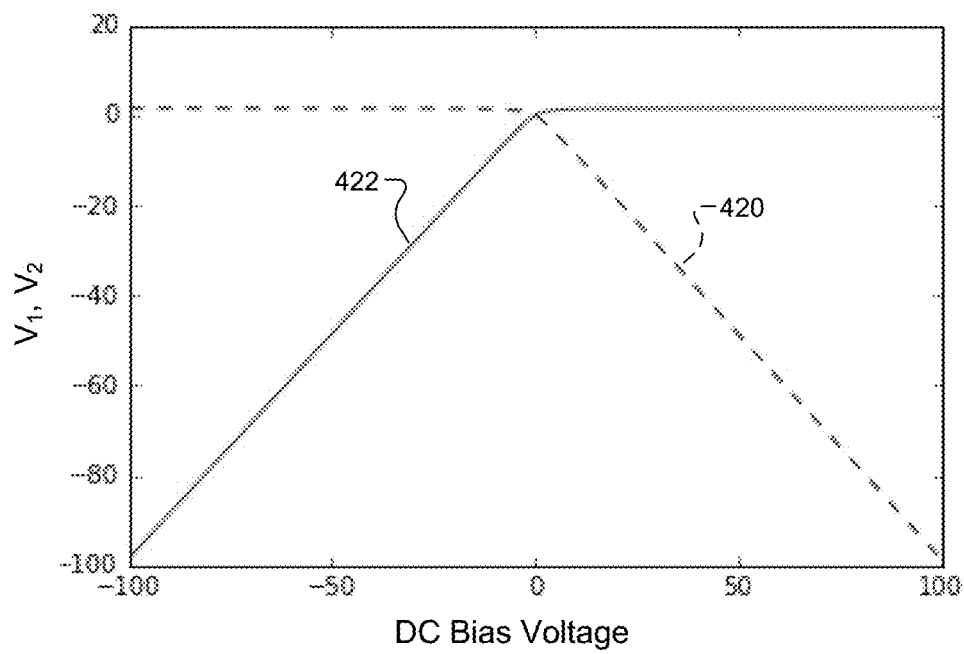
FIG. 11A is a plot of diode voltages versus DC bias voltage for the back-to-back diode varactor of FIG. 9A without a bypass capacitor and a RF choke.
Figure 11B:
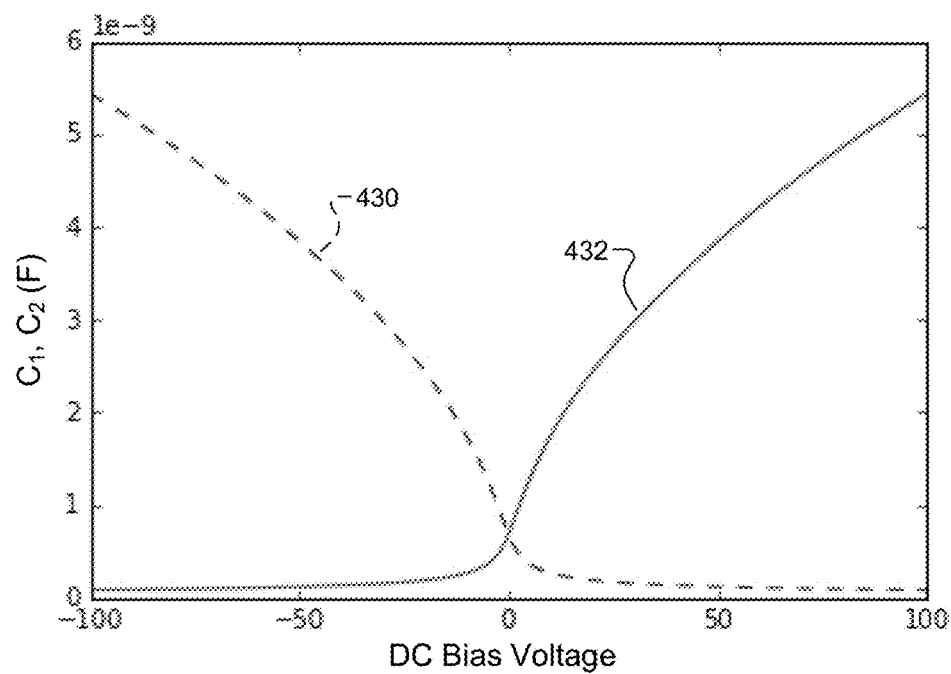
FIG. 11B is a plot of diode capacitances versus DC bias voltage for the back-to-back diode varactor of FIG. 9A without a bypass capacitor and a RF choke.
Figure 11C:
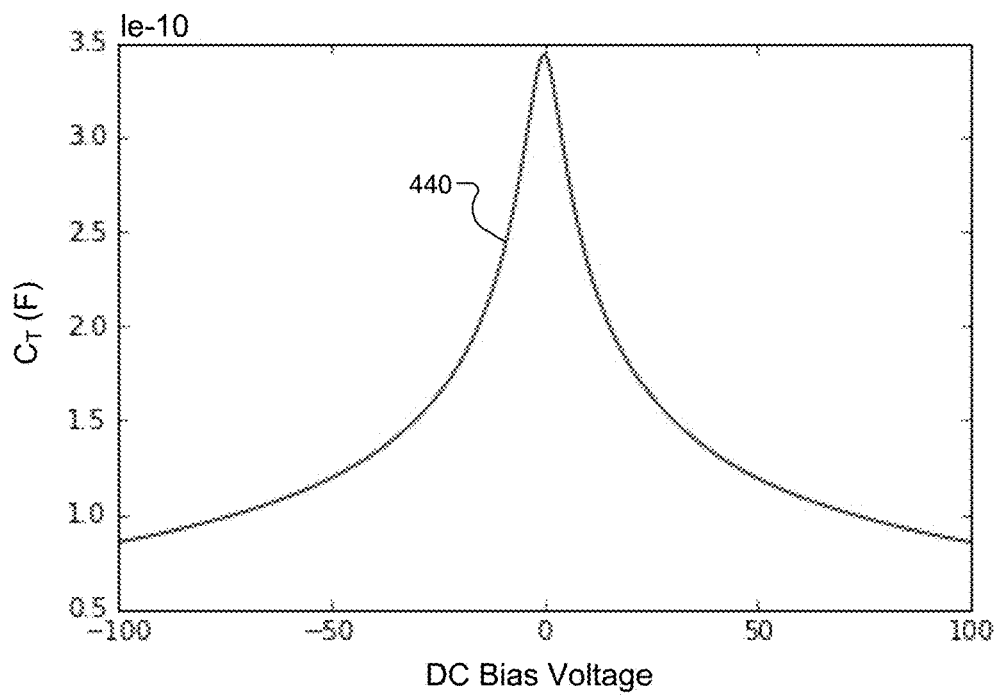
FIG. 11C is a plot of capacitance versus DC bias voltage of the back-to-back diode varactor of FIG. 9A without a bypass capacitor and a RF choke.

For a small RF input signal (e.g., less than 10V peak-to-peak), the following equations 5-11 and FIGS. 11A-11C may be used or a variation thereof depending upon the components incorporated in the varactor being monitored and/or operated. Equations 5-11 and plots of FIGS. 11A-11B are for the back-to-back diode varactor of FIG. 8A without RF chokes (e.g., the inductors L1, L2) and without one or more bypass capacitors (e.g., the capacitor C1).

If the power law exponent n of equation 4 is equal to 0.5, equation 4 can be converted to equation 5.

$$C = \frac{K}{\sqrt{\phi - V}} \quad (5)$$

The capacitance relationship of equation 5 has a corresponding sharply non-linear capacitance-voltage curve with a highest capacitance at a smallest magnitude of a DC bias voltage. Since the diodes D1, D2 are arranged back-to-back in series, the anodes of diodes D1, D2 have equal and opposite charge, such that charge Q1 of diode D1 is equal to charge Q2 of diode D2, where $V_1$ is voltage across diode D1 and represented by curve 420 in FIG. 11A. The charge Q1 is represented by equation 6 and the charge Q2 is represented by equation 7, where voltage $V_2$ is voltage across diode D2 and represented by curve 422 in FIG. 11A. Setting Q1 equal to Q2 provides equation 8.

$$Q1 = \frac{KV_1}{\sqrt{\phi - V_1}} \quad (6)$$

$$Q2 = \frac{KV_2}{\sqrt{\phi - V_2}} \quad (7)$$

$$\frac{KV_1}{\sqrt{\phi - V_1}} = \frac{KV_2}{\sqrt{\phi - V_2}} \quad (8)$$

In addition, since voltages across the diodes D1, D2 are defined from anode to cathode, a total voltage V across the diodes D1, D2 is represented by equation 9.

$$V = V_2 - V_1 \quad (9)$$

Equations 7-9 may be used to solve for $V_1$ and/or $V_2$. For example, since $V_2$ is equal to V plus $V_1$, equation 8 can be converted to provide equation 10.

$$\frac{KV_1}{\sqrt{\phi - V_1}} = \frac{(K(V + V_1))}{\sqrt{\phi - (V + V_1)}} \quad (10)$$

Solving for $V_1$ in terms of V provides equation 11. A similar equation can be provided for $V_2$.

$$V_1 = -\frac{V}{2} + \phi - \frac{1}{2}\sqrt{V^2 + 4\phi^2} \quad (11)$$

FIG. 11A provides an example plot of $V_1$, $V_2$ versus DC bias voltage.

Capacitances $C_1$, $C_2$ respectively of the diodes D1, D2 and a total capacitance $C_T$ across the diodes D1, D2 can be determined using equations 12-14. These capacitances may be determined via the modules and/or devices 350, 164, 180, 362 of FIGS. 5-7 and/or during the method of FIG. 21.

$$C_1 = \frac{K}{\sqrt{\phi - V_1}} \quad (12)$$

$$C_2 = \frac{K}{\sqrt{\phi - V_2}} \quad (13)$$

$$C_T = \frac{1}{\sqrt{\frac{1}{C_1} + \frac{1}{C_2}}} \quad (14)$$

FIG. 11B shows curves 430, 432 respectively of capacitances $C_1$, $C_2$ versus DC bias voltage. FIG. 11C shows a curve 440 of the total capacitance $C_T$ versus DC bias voltage.

Varactor Circuit Variants

Figure 8B:
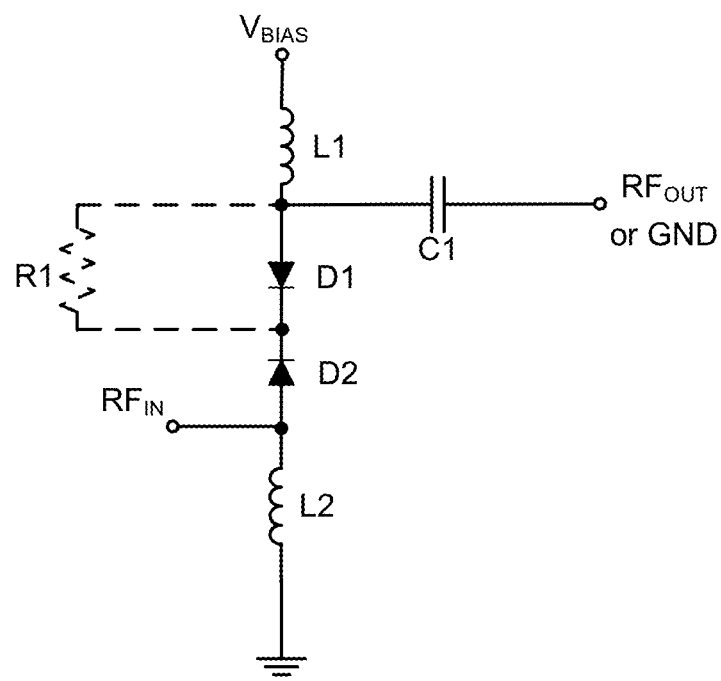
FIG. 8B is a schematic of a back-to-back diode varactor with cathode connected diodes in accordance with an embodiment of the present disclosure.

The back-to-back diode configuration of the back-to-back diode varactor 400 reduces harmonics that can result from a nonlinear capacitance-RF input voltage relationship. Harmonics are reduced because capacitance of one diode increases while capacitance of the other diode decreases, due to charge conservation. If a DC bias voltage is applied, the center node (or node between the anodes of diodes D1, D2) is charged. A voltage across the diodes, D1, D2 slowly decays when the DC bias voltage is removed depending upon a leakage current of diode D1. This can cause issues if very fast capacitance changes are required. A bleeder resistor R1 (e.g., a 100 kilo-Ohm resistor) may be connected across the diode D1 to allow faster changes in the DC bias voltage, as shown or may be connected between (i) the diodes D1, D2 and (ii) ground. A first end of the bleeder resistor R1 may be connected to the center tap between the diodes D1, D2 and a second end of the bleeder resistor R1 may be connected to ground. Although FIG. 8A shows the diodes D1, D2 connected anode-to-anode, the diodes may be connected cathode-to-cathode, where the respective anodes of the diodes D1, D2 are connected to (i) the inductor L1 and the capacitor C1, and (ii) the RF input terminal and the inductor L2. This is shown in FIG. 8B.

The back-to-back diode varactor 400 responds to changes in the DC bias voltage. The changes are a function of the applied RF input voltage. This is shown in FIG. 9A. With varying RF power levels, the applied RF input voltage has a noticeable impact to a range of capacitance of the back-to-back diode varactor 400. To understand a magnitude of this effect, differences in capacitance for different RF power levels and DC bias voltages for the back-to-back diode varactor 400 are shown in FIG. 9B. At high-power levels, the effect the RF power level has on the change in capacitance is reduced. For this reason, the back-to-back diode varactor 400 may be used for fine tuning purposes in combination with the FET switched capacitance circuit 50.

The DC bias voltage may be set high to minimize the effect of RF power level on the capacitance of the back-to-back diode varactor 400, thereby allowing the capacitance to be fine-tuned from a set point or range set by the FET switched capacitance circuit 50. The capacitance is fined tuned by adjusting the DC bias voltage.

FIG. 12 shows a hybrid tuning network 500 with a coarse tuning network 502 and a fine tuning network 504. The fine tuning network 504 is connected in parallel with the coarse tuning network 502 between an RF input terminal 505 and an RF output or reference terminal 506. If the terminal 506 is a reference terminal, the reference terminal 506 may be connected to ground. Although the coarse tuning network 502 is shown as a switchable circuit including FETs, the coarse tuning network 502 may include PIN diodes, relays, and/or other elements having controllable state changes. The coarse tuning network 502 includes one or more FET switch capacitance circuits 508 (m FET switch capacitance circuits are shown). In one embodiment, the coarse tuning network 502 includes five FET switch capacitance circuits 508. The fine tuning network 504 includes one or more varactors 509 (n varactors are shown). In one embodiment, each of the varactors 509 includes two pairs of back-to-back diodes. In an embodiment, the fine tuning network 504 includes two varactors. An inductor $L_{RF}$ is connected between the RF input terminal 505 and ground. The FET switch capacitance circuits 508 and the varactors 509 output respective RF output signals to the RF output or reference terminal 506 depending on whether the hybrid tuning network 500 is included in a shunt eVC (e.g., $C_{LOAD}$) or a series eVC (e.g., $C_{TUNE}$).

Each of the FET switch capacitance circuits 508 includes corresponding: transistors T1, T2; capacitors C1, C2, C3, C4; inductors L1, L2, L3, L4, L5; and resistors R1, R2, R3. The transistors T1, T2 may be power metal-oxide-semiconductor field-effect transistors (MOSFETs) with source-to-drain diodes, as shown or may be replaced with other switching devices, such as other types of transistors and/or RF switches (e.g., microelectromechanical (MEM) switches). The capacitances, inductances and resistances of the circuit elements of each of the FET switch capacitance circuits 508 may be different. In one embodiment, the capacitances of the transistors T1, T2 and the capacitors C1, C2, C3, C4 of each of the FET switch capacitance circuits 508 are different, such that each of the FET switch capacitance circuits 508 provides a different overall capacitance.

For each of the FET switch capacitance circuits 508, sources of the transistors T1, T2 are connected to the inductor L2, which is connected to ground. Gates of transistors T1, T2 are connected to the inductor L1. The resistor R1 and the inductor L1 are connected in series between the gates and a control terminal 510. A drain of the transistor T1 is connected to capacitors C1, C2 and to inductor L3. Capacitors C1, C2 are connected in parallel between the drain of transistor T1 and the RF input terminal 505. Inductors L3, L4 and resistor R2 are connected in series between the drain of transistor T1 and a bias input terminal 512, which receives a corresponding DC bias voltage. The DC bias voltage may be received from one of the modules and/or devices 350, 164, 180, 362 of FIGS. 5-7. Inductor L5 and resistor R3 are connected between a drain of transistor T2 and the bias input terminal 512. Capacitors C3, C4 are connected in parallel between the drain of the transistor T2 and the RF output or reference terminal 506.

The inductors L1, L2, L3, L4, L5 block RF signals from passing to control circuits, DC bias circuits and/or ground. More RF power is received at the drain of the transistor T1 than exists at the sources of transistors T1, T2 and/or the drain of transistor T2. For this reason, two inductors L3, L4 are provided between the drain of transistor T1 and the DC bias terminal 512 to provide added protection to prevent RF power from passing from the capacitors C1, C2 to the DC bias terminal 512. Each of the FET switch capacitance circuits 508 has a respective DC bias terminal and receives a respective DC bias voltage.

Each of the varactors 509 includes a first pair of back-to-back diodes D1, D2, a second pair of back-to-back diodes D3, D4, resistors R1, R2, inductor L1 and capacitors C1, C2, C3. Anodes of the diodes D1, D2 may be connected to each other and anodes of diodes D3, D5 may be connected to each other. In another embodiment, cathodes of the diodes D1, D2 are connected to each other and cathodes of the diodes D3, D4 are connected to each other. The diodes D1, D2 and inductor L1 are connected in series between the RF input terminal 505 and a DC bias terminal 520. The diodes D1, D2, D3, D4 are biased based on a received DC bias voltage. Each of the varactors 509 may have a respective DC bias terminal and receives a respective DC bias voltage. In the embodiment, shown, the varactors 509 have a common DC bias terminal 520 and receive a same DC bias voltage.

Resistors R1 of the varactors 509 are connected between the anodes of D1, D2 and ground. Resistors R2 are connected between the anodes of D3, D4 and ground. Cathodes of diodes D2, D4 are connected to each other. Capacitors C1, C2, C3 of the varactors 509 are connected in parallel and between the cathodes of the diodes D2, D4 and the RF output or reference terminal 506.

Figure 20:
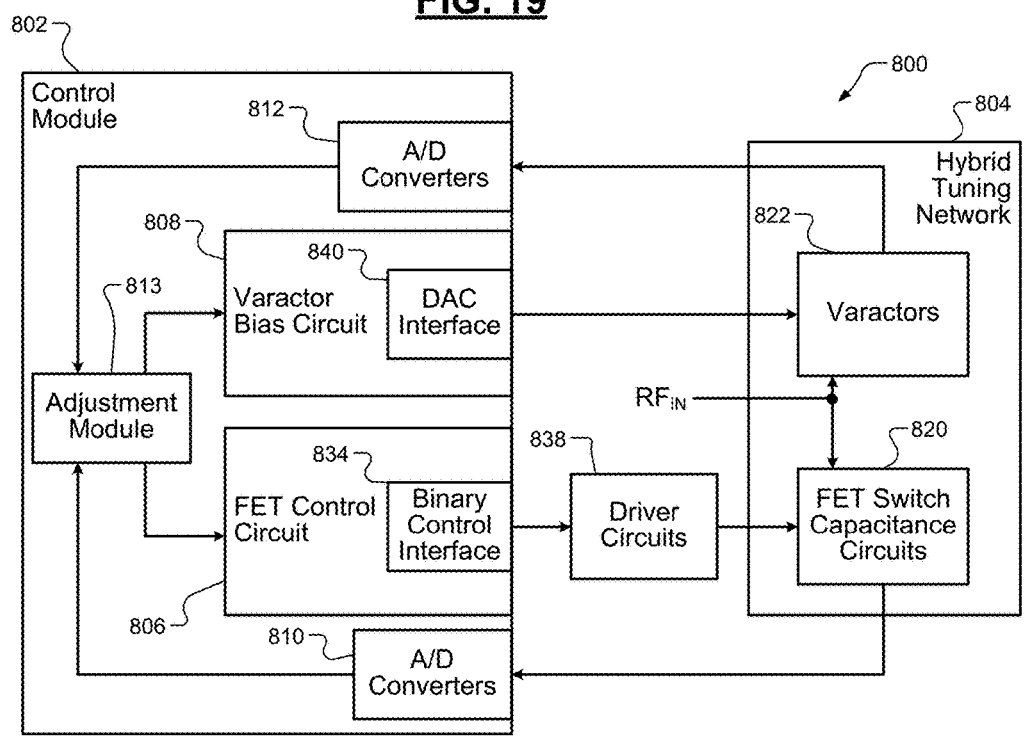
FIG. 20 is a functional block diagram of a control circuit for supplying control signals and DC bias voltages to a hybrid tuning network in accordance with an embodiment of the present disclosure.

The DC bias voltages provided to the DC bias terminals (e.g., 512, 520) of the FET switch capacitance circuits 508 and the varactors 509 may be between 0-800 VDC and provided by a digital-to-analog (D-to-A) converter (e.g., an example of a D-to-A converter is shown in FIG. 20). The D-to-A converter may include converters, transformers, and/or other circuit elements to convert 0-3.3 VDC to 0-800 VDC. DC bias voltages are provided to the FET switch capacitance circuits when the transistors T1, T2 are OFF (or during a FET capacitance control mode). A DC bias voltage (or voltages) are provided to the varactors 509 during a varactor capacitance control mode. These modes are further described below with respect to FIG. 21.

Although FIG. 12 shows incorporation of both a switchable network (or multiple FET switch capacitance circuits) and a varactor network (or multiple varactors), in certain embodiments, only the switchable network or only the varactor network are included as part of a tuning network. For example, in one embodiment, the one or more of the varactors 509 are connected in parallel and are implemented without the FET switch capacitance circuits. This provides a varactor-based timing network, which may be implemented as $C_{LOAD}$ and/or $C_{TUNE}$.

Figure 13:
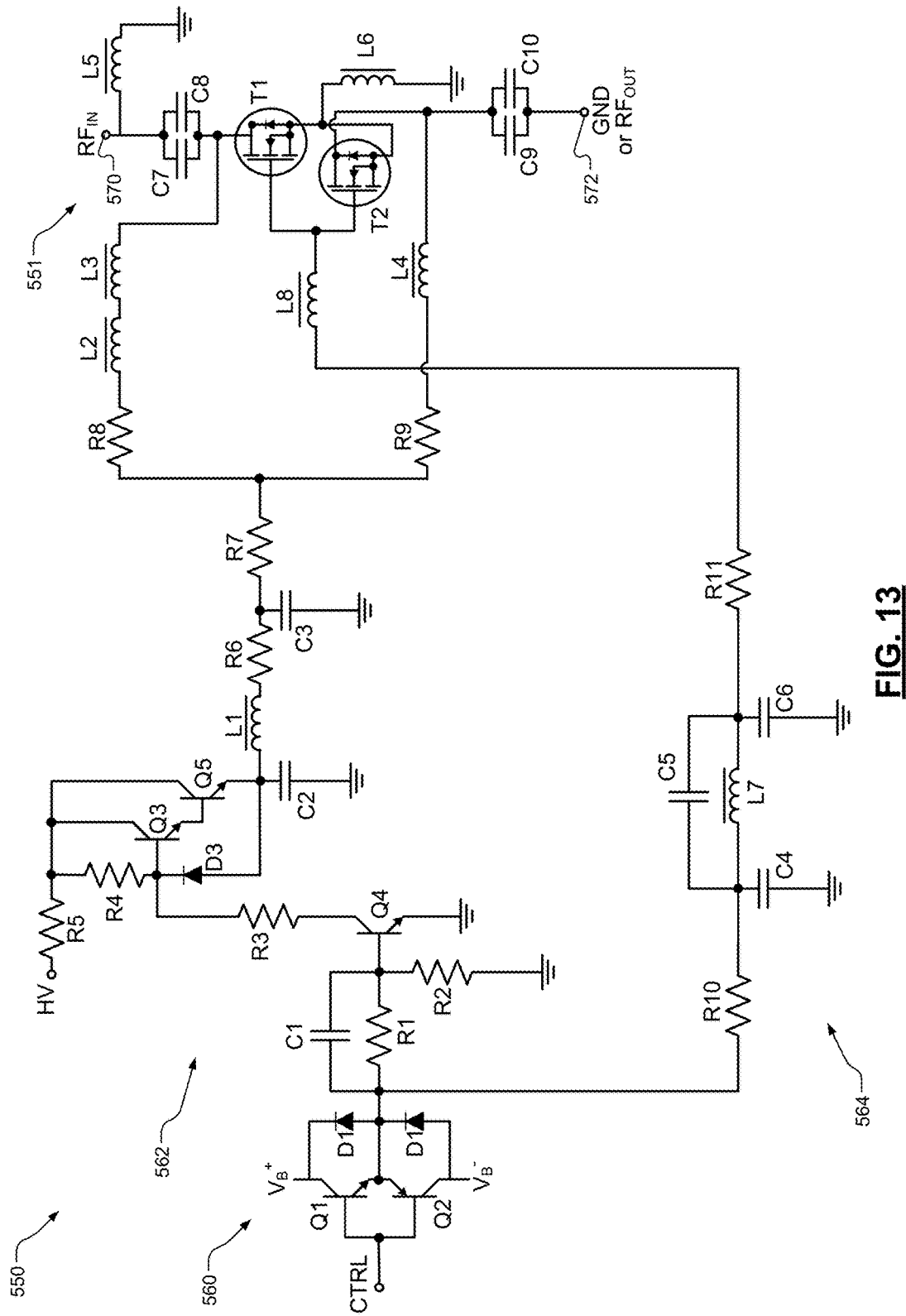
FIG. 13 is a schematic view of a switch driver circuit in accordance with an embodiment of the present disclosure.

FIG. 13 shows a switch driver circuit 550 that provides fast switching between states of FETs of a coarse tuning network (e.g., the coarse tuning network 502 of FIG. 12) of a hybrid tuning network. A version of the switch driver circuit 550 may be provided for each of the FET switch capacitance circuits of a coarse tuning network of a hybrid tuning network. The switch driver circuit 550 provides (i) control signals to gates of FETs T1, T2 of a FET switch capacitance circuit 551, and (ii) DC bias voltages to drains of the FETs T1, T2. The DC bias voltages are provided when the FETs T1, T2 are OFF or when the gates of the FETs T1, T2 are low. The DC bias voltage is switched ON and OFF to swing voltage across the FETs T1, T2 between a high-voltage (e.g., 600-800 VDC) and 0V. The DC voltage swings between the high-voltage and 0V at a switching rate of, for example, less than 10 micro-seconds (μs). The switch driver circuit 550 provides a cascade transistor configuration that provides the quick transition between the high-voltage and 0V.

The switch driver circuit 550 includes a bipolar combination circuit 560, a bias control circuit 562, and a switch control circuit 564. The bipolar combination circuit 560 controls states of the circuits 562, 564 and whether a predetermined voltage (e.g., 12V) is provided to the circuits 562, 564 to enable operation of the circuits 562, 564. The bias control circuit 562 controls whether a predetermined bias voltage (e.g., 600-800 VDC) is provided to the FETs T1, T2. The switch control circuit 564 controls ON/OFF states of the FETs T1, T2.

The bipolar combination circuit 560 includes transistors Q1, Q2, diodes D1, D2. Bases of the transistors Q1, Q2 receive a control signal CTRL, which may be generated by one of the modules and/or devices 350, 164, 180, 362 of FIGS. 5-7. The control signal CTRL turns ON and OFF the bipolar combination circuit 560. A collector of Q1 is connected to a cathode of D1 and receives a supply voltage $V_B$. Emitters of Q1, Q2 are connected to each other and to an anode of D1 and a cathode of D2. A collector of Q2 is connected to an anode of D2 and to a terminal at a supply voltage $-V_B$.

The bias control circuit 562 includes transistors Q3-Q5, resistors, R1-R9, capacitors C1-C3, diode D3, and inductors L1-L4. The resistor R1 and capacitor C1 are connected in parallel and to (i) an output of the bipolar combination circuit 560, (ii) resistor R2, and (iii) a base of Q4. The resistor R2 is connected to ground. An emitter of Q4 is connected to ground. A collector of Q4 is connected to resistor R3, which is connected to resistor R4, base of Q3 and a cathode of D3. Resistor R4 is connected to resistor R5 and collectors of transistors Q3, Q5. Transistors Q3, Q5 are connected as a Darlington pair. Resistor R5 receives a high DC bias voltage (e.g., 600-800 VDC) from a voltage supply. An emitter of Q3 is connected to a base of Q5. An emitter of Q5 is connected to an anode of D3, the capacitor C2 and the inductor L1. The capacitor C2 is connected to ground. The inductor L1 is connected to R6 and is in series with R6 and R7. Although not shown, a capacitor may be connected (i) across the inductor L1, (ii) at a first end to the anode of D3, the emitter of Q5 and C2, and (iii) at a second end to resistor R6. The resistor R6 is connected to capacitor C3 and resistor R7. The capacitor C3 is connected to ground. The resistor R7 is connected to resistors R8 and R9. Resistor R8 and inductors L2, L3 are connected in series between the resistor R7 and a drain of T1. The resistor R9 and inductor L4 are connected in series between the resistor R7 and a drain of T2.

The switch control circuit 564 includes resistors R10, R11, capacitors C4, C5, C6 and inductors L7, L8. Resistor R10, inductor L7, resistor R11 and inductor L8 are connected in series between (i) the output of the bipolar combination circuit 560 and (ii) gates of the transistors T1, T2. Capacitor C4 is connected between (i) the resistor R10, the capacitor C5 and the inductor L7, and (ii) ground. Capacitor C5 is connected in parallel with inductor L7. Capacitor C6 is connected between (i) capacitor C5, inductor L7, and resistor R11, and (ii) capacitor C6. The resistor R11 is connected to the inductor L8, which is connected to gates of T1, T2.

The FET switch capacitance circuit 551 includes the FETs T1, T2, capacitors C7-C10 and inductors L5, L6. Capacitors C7, C8 are connected in parallel between an RF input terminal 570 and a drain of T1. Inductor L5 is connected between the RF input terminal 570 and ground. Inductor L6 is connected between sources of the T1, T2 and ground. Capacitors C9, C10 are connected in parallel between a drain of T2 and an RF output terminal or ground 572. Capacitors C9, C10 are connected to an RF output terminal if the FET switch capacitance circuit 551 is part of a tuning capacitor (e.g., the tuning capacitor 314 of FIG. 7). Capacitors C9, C10 are connected to ground if the FET switch capacitance circuit 551 is part of a load capacitance (e.g., load capacitor 312 of FIG. 7).

During operation, if the control signal CTRL is HIGH, then Q1, Q2 are ON. Since Q1, Q2 are ON, the FETs T1, T2 are ON, Q4 is ON, Q3 and Q5 are OFF and the bias voltage provided to the FETs is 0V. If the control signal CTRL is LOW, then Q1, Q2 are OFF. Since Q1, Q2 are OFF, the FETs T1, T2 are OFF, Q4 is OFF, Q3 and Q5 are ON and the bias voltage provided to the FETs is at a high-voltage (e.g., 600-800 VDC). The cascade transistor arrangement of Q3, Q5 allows for a bias voltage switching rate of less than 10 μs.

Voltage Stress Reduction

Possibly the greatest challenge associated with a solid-state variable capacitor is handling voltage stress. To complement the hybrid tuning networks disclosed herein, impedance transformation techniques are disclosed to reduce voltage stress. This is especially applicable for a tuning capacitor (e.g., the timing capacitor 314 of FIG. 7) of an impedance matching network. As an example, the voltage stress of a tuning capacitor can be greater than 2800 root mean squared voltage (Vrms) when 3 kilo-watts (KW) is applied at an RF input for a tuned condition and received by the tuning capacitor. Three approaches are described to limit the voltage stress associated with impedance matching networks and include impedance transformation, transformer coupling, and modified impedance matching.

Impedance Transformation

Traditionally, an input impedance to an impedance matching network is 50 Ohms (Ω) and matches a characteristic impedance of a line section coupling a RF power supply to a load. As disclosed herein, the input impedance is scaled at the RF input from 50Ω to an impedance less than 50Ω. Voltage drop is a square root of impedance drop. For instance, if the impedance changes by a factor of 2 from 50Ω to 25Ω, then voltage stress can decrease by a factor of $\sqrt{2}$.

The impedance transformation may be provided via a transformer. A transformer may be connected between the RF input and the load and tuning capacitors of an impedance matching network. For example, a transformer may be connected between (i) resistor 330 and (ii) capacitors 312, 314 of FIG. 7. The primary and secondary windings of the transformer may be preconfigured to provide a predetermined impedance transformation (e.g., 50Ω to 25Ω). An example impedance transformation transformer 602 is shown in FIG. 14.

Figure 14:
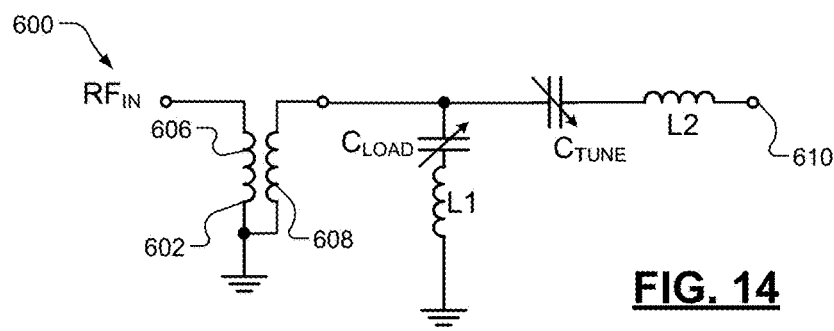
FIG. 14 is a schematic diagram of an impedance matching network including an impedance transformation transformer in accordance with an embodiment of the present disclosure.

FIG. 14 shows another impedance matching network 600 that includes an impedance transformation transformer 602 and includes a load capacitor $C_{LOAD}$, an inductor L1, a tuning capacitor $C_{TUNE}$, and an inductor L2. The impedance transformation transformer 602 includes a primary winding 606 and a secondary winding 608. The primary winding 606 receives a RF input signal. The output of the secondary winding 608 is connected to the capacitors $C_{LOAD}$, $C_{TUNE}$. The capacitors $C_{LOAD}$, $C_{TUNE}$ may be implemented similarly to the capacitors 312, 314 of FIG. 7. The capacitor $C_{LOAD}$ is connected in series with the inductor L1 and between the output of the transformer 602 and ground. The capacitor $C_{TUNE}$ is connected in series with the inductor L2 and between the output of the transformer 602 and an output terminal 610 of the impedance matching network 600.

Transformer Coupling

Figure 15A:
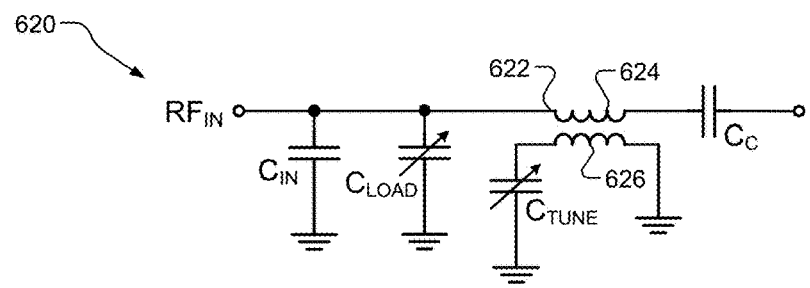
FIG. 15A is a schematic diagram of an impedance matching network in accordance with an embodiment of the present disclosure.

FIG. 15A shows another impedance matching network 620 that includes an input capacitor $C_{IN}$, a load capacitor $C_{LOAD}$, a transformer 622, a timing capacitor $C_{TUNE}$, and an output capacitor $C_C$. The transformer 622 includes a primary winding 624 and a secondary winding 626. The capacitors $C_{IN}$, $C_{LOAD}$ are connected between the primary winding 624 and ground and receive an RF input signal. The capacitors $C_{LOAD}$, $C_{TUNE}$ may be implemented similarly to the capacitors 312, 314 of FIG. 7. The primary winding 624 is connected between an RF input terminal and the capacitor $C_C$. The capacitor $C_{TUNE}$ is connected between the second winding 626 and ground. The secondary winding 626 is connected between the capacitor $C_{TUNE}$ and ground.

The electronic variable elements that are susceptible to the highest voltage stress (i.e. the capacitors $C_{LOAD}$, $C_{TUNE}$) are transformer coupled via the transformer 622. The transformer 622 may be implemented as an air-wound transformer having an air-wound coil, where the secondary winding 626 is wrapped around a tubular coil. The primary winding 624 is located within a channel of the tubular coil. The channel includes air. The air within the channel and the insulative (or dielectric) material of the tubular coil provide an insulative barrier between the primary winding 624 and the secondary winding 626. An example of an air-wound transformer is shown in FIG. 18.

Figure 15B:
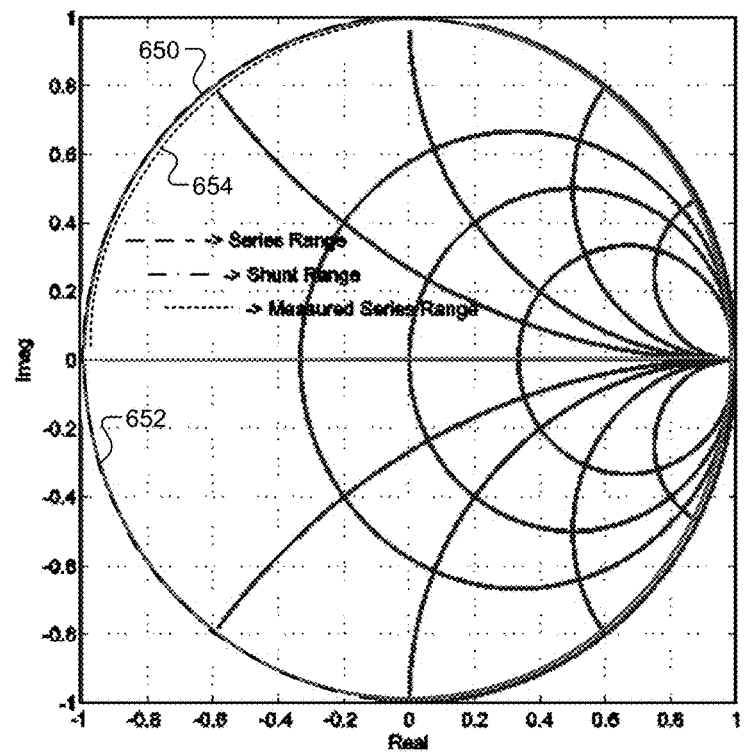
FIG. 15B is a Smith chart of reactance of tuning and load capacitances of the impedance matching network of FIG. 15A.
Figure 16A:
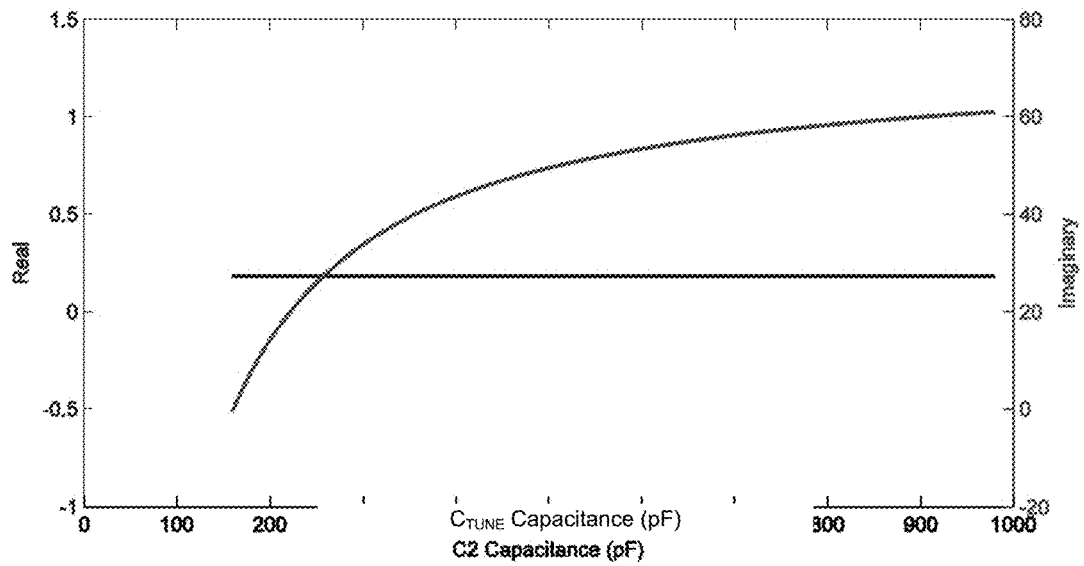
FIG. 16A is a plot of series reactance of a tuning capacitance without an air-wound transformer.
Figure 16B:
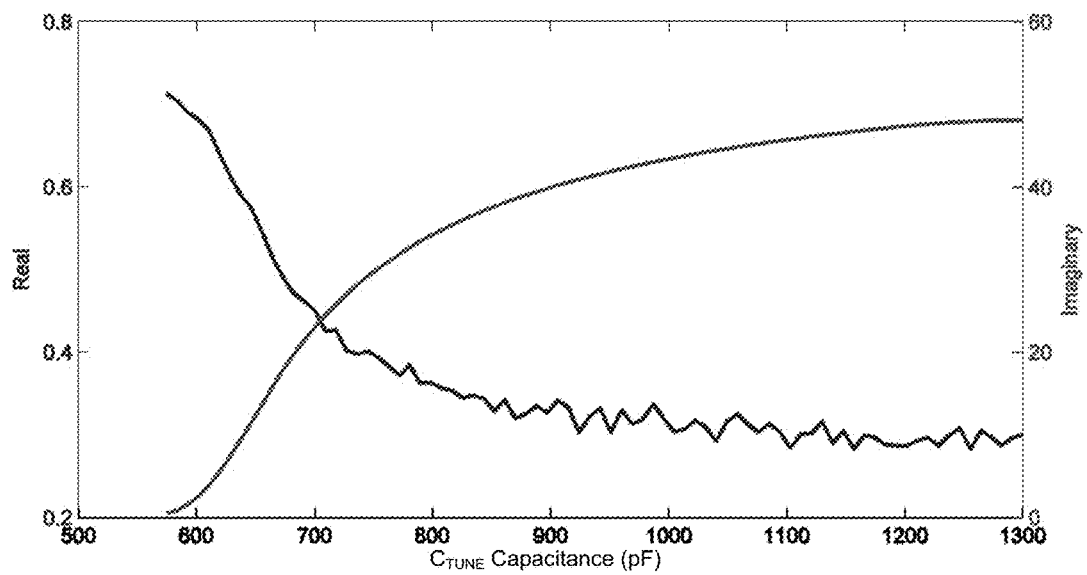
FIG. 16B is a plot of series reactance of a tuning capacitance with an air-wound transformer.

Example series and shunt reactance curves are respectively shown in FIG. 15B for the capacitor $C_{TUNE}$ and capacitor $C_{LOAD}$ using an air-wound transformer. A series reactance range 650, a shunt reactance range 652 and a measured series reactance range 654 are shown. FIG. 16A shows model driven requirements for the series reactance without the air-wound transformer for a capacitance range of 160 to 980 pF. FIG. 16B shows actual measured series reactance with transformer coupling. The series reactance of FIG. 16B overlaps modelled reactance requirements for an impedance matching tune space. The change in the capacitance between the plots of FIGS. 16A, 16B is related to a number of turns of the air-wound transformer and a corresponding impedance transformation of the air-wound transformer, which is a second benefit with transformer coupling. The eVC range of the impedance matching network is increased as a function of a number of turns of the air-wound transformer.

Modified Impedance Matching

Figure 17:
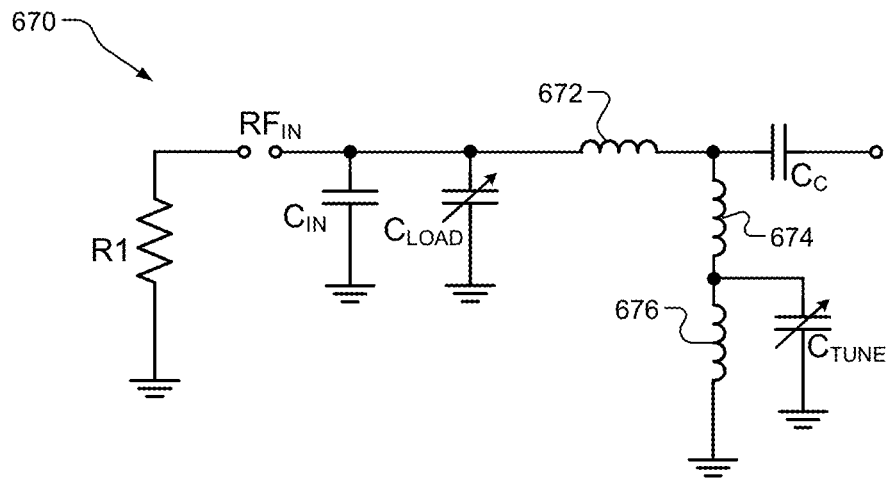
FIG. 17 is a schematic diagram of another impedance matching network in accordance with an embodiment of the present disclosure.

FIG. 17 is a schematic diagram of another impedance matching network 670 that includes an input capacitor $C_{IN}$, a load capacitor $C_{LOAD}$, inductor 672, 674, 676, a tuning capacitor $C_{TUNE}$, and an output capacitor $C_C$. Resistance of a RF power supply is represented by resistor R1. The capacitors $C_{IN}$, $C_{LOAD}$ are connected between the inductor 672 and ground and receive an RF input signal from the RF power supply. The capacitors $C_{LOAD}$, $C_{TUNE}$ may be implemented similarly to the capacitors 312, 314 of FIG. 7. The inductor 672 is connected between an RF input terminal and the capacitor $C_C$. The inductors 674, 676 are connected in series between (i) the inductor 672 and the capacitor $C_C$, and (ii) the inductor 676 and the capacitor $C_{TUNE}$. The capacitor $C_{TUNE}$ is connected between (i) an output of the inductor 674 and input of the inductor 676, and (ii) ground. The inductor 676 is connected between the inductor 674 and ground. The capacitor $C_C$ is connected between (i) the inductors 672, 674 and an output terminal of the impedance matching network 670. By the capacitor $C_{TUNE}$ being connected to a node between the inductors 674, 676, the capacitor $C_{TUNE}$ is connected to a lower voltage stress node. The capacitor $C_{TUNE}$ may be a solid-state variable capacitor. Although FIG. 17 is directed to reducing voltage stress for the capacitor $C_{TUNE}$, a similar implementation may be provided to reduce voltage stress for $C_{LOAD}$.

Dual Enclosure

FIG. 18 is a view of a dual enclosure. The dual enclosure includes a first (outer) enclosure 700 and a second (inner) enclosure 702. The inner enclosure 702 is within the outer enclosure 700. The outer enclosure 700 is an air-tight enclosure, such that air is unable to enter or exit the outer enclosure 700. One or more hybrid tuning networks (a single hybrid tuning network 704 is shown) are disposed within the inner enclosure 702 and are cooled via fans 708, 710 and a heat exchanger 712. Any of the hybrid tuning networks disclosed herein and/or corresponding impedance matching circuits may be disposed within the inner enclosure 702.

In the example shown, the fan 708 directs air out of the inner enclosure 702 and into the outer enclosure 700. The fan 710 directs air from the outer enclosure 700 into the inner enclosure 702. The air is passed through the heat exchanger 712. Although two fans are shown, one or more fans may be included. As an alternative embodiment, the fans 708, 710 may both direct air (i) into the inner enclosure 702, or (ii) out of the inner enclosure 702. If the fans 708, 710 are both directing air in the same direction, the inner enclosure 702 may have openings (e.g., holes) to allow air to pass through a wall of the inner enclosure 702 and between (i) an area in the inner enclosure and (ii) an area exterior to the inner enclosure 702 and in the outer enclosure 700.

A cooling fluid (e.g., water) is circulated in and out of the heat exchanger 712 and in and out of the outer enclosure 700 to cool the air passing through the heat exchanger 712. An alternative to using the heat exchanger 712, fins may be mounted within the outer enclosure 700 along outer surfaces of the outer enclosure 700. The fins increase surface area and remove heat from the outer enclosure 700.

An air-wound transformer 714 is shown and is connected to the hybrid tuning network 704. The air-wound transformer 714 may be implemented as described above with respect to FIG. 15A. The air-wound transformer 714 includes a primary coil 715 and a secondary coil 717. The secondary coil 717 is wrapped around the primary coil 715. The primary coil 715 may be an air-wound coil. A first end 719 of the primary coil 715 may be connected to capacitor $C_{LOAD}$ (an example of a first end of a primary coil being connected to a capacitor $C_{LOAD}$ is shown in FIG. 15A). A second end 721 of the primary coil 715 may be connected to capacitor $C_C$. A first end 723 of the secondary coil 717 may be connected to capacitor $C_{TUNE}$ (an example of which is shown in FIG. 15A). A second end 725 of the secondary coil 717 may be connected to ground.

The hybrid tuning network 704 may be implemented as capacitor $C_{LOAD}$ or capacitor $C_{TUNE}$ and include a coarse tuning network 716 and a fine tuning network 718. The coarse tuning network 716 and the fine tuning network 718 may be implemented as any of the coarse tuning networks and fine tuning networks disclosed herein. As an example, the coarse tuning network 716 may be implemented as a FET switch capacitance circuit and the fine tuning network 718 may be implemented as a varactor circuit. Although a single hybrid tuning network is shown in FIG. 18, more than one hybrid tuning network may be implemented within the inner enclosure 702.

Conventional matching networks utilize fans for convection cooling electromechanical devices. Air is exchanged from within an enclosure with air in a local environment external to the enclosure by convection cooling. For solid-state devices used in an eVC, a high-volume of air exchange brings particles into an enclosure, and over time, may cause generation of undesirable conductive paths overlaying circuitry. The embodiment of FIG. 18 provides a dual enclosure that has a high volume of pressurized air to cool components of an impedance matching network without being open to exterior particles. The embodiment of FIG. 18 mitigates parasitic impedances from affecting circuit performance by having limited conduction cooling. The dual enclosure minimizes contaminates and prevents accumulation of particles overtime. The accumulation of particles can degrade operation of eVCs. The dual enclosure embodiment: (1) removes heat from the inner enclosure 702 via the fans 708, 710 and heat exchanger 712; (2) provides a larger surface area within the outer enclosure 700 for heat exchange without a coolant filled heat exchanger; and (3) may circulate compressed air in the inner enclosure 702 for thermal convection cooling. In the event a component of an eVC fails, the sealed outer enclosure 700 prevents a release into a clean room environment any particles from within the inner enclosure 702. If a failure of a solid-state device occurs, emission of toxic gas and particles can occur, which are contained within the enclosures 700, 702. This embodiment is different than direct conduction cooling of RF semiconductor devices.

Additionally, many plasma reactors are heated for semiconductor manufacturing processes, which can impinge on thermal operation of devices used in an electronic matching network if conduction cooling is the primary thermal solution. The electronic devices of the networks 716, 718, which may be implemented on a PCB are not mounted directly to a heat sink. The electronic devices may be mounted upright and primarily cooled using convection cooling. Fans blow and circulate air within the volume of the inner enclosure 702. Heat is removed from the inner enclosure 702. This prevents dissipation, which can occur in various circuit elements of an impedance matching network without heat removal. The stated-embodiments prevent conductive particles from being brought into the inner enclosure 702 and being deposited on circuit components and adversely affecting operation of the impedance matching network.

Calibration

Figure 19:
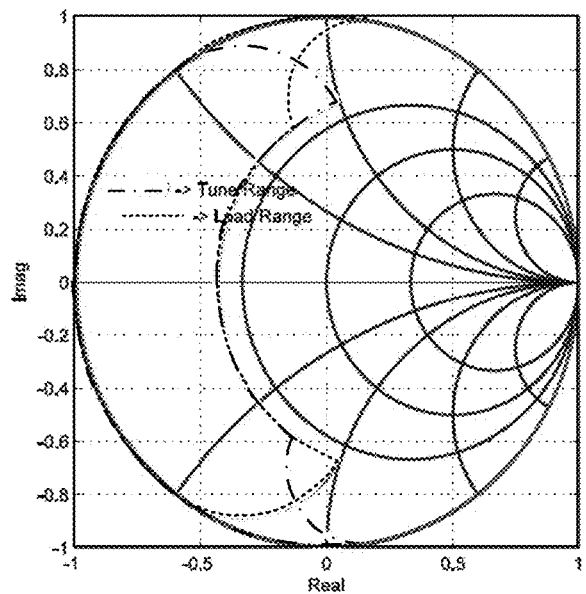
FIG. 19 is a Smith chart of a tune and load space of an impedance matching network including a hybrid tuning network in accordance with an embodiment of the present disclosure.

FIG. 19 shows an example Smith chart of a tune and load space of an impedance matching network including a hybrid tuning network. The load space is the impedance region that the impedance matching network can translate to a source impedance. The tune space is the impedance to convert the load impedance to the source impedance. A metric widely used in industry is repeatability of a tune space between multiple manufactured impedance matching networks. Many suppliers of conventional impedance matching networks calibrate a tune impedance range to a specification to reduce variability from component to component.

The parallel combination of FET switch capacitance circuits and varactors provided by the disclosed hybrid tuning networks enable a tuning method of an impedance matching network, which includes solid-state eVCs. The plot of capacitance of a varactor as a function of bias voltage shown in FIG. 16A indicates a varying range of capacitance. In one embodiment, calibration includes setting a particular bias voltage for each varactor of a hybrid tuning network. This yields a more reproducible product. More importantly, a wide range of capacitance and different combinations of FET switch configurations provide multiple solutions. For example, a particular tune impedance may be achieved by providing (i) a low bias voltage to set a varactor at a high capacitance, and (ii) a FET switch configuration with a low capacitance range. Similarly, the same reactance could be achieved for a high bias varactor voltage to obtain a low varactor capacitance with the FET switches configured to a high capacitance value. The parallel configuration provides reasonable tuning conditions with different network configurations. The disclosed calibration method alleviates the repeatability problem and enables a hybrid tuning control method described below with respect to FIG. 21.

FIG. 20 shows a control circuit 800 including a control module 802 and a hybrid tuning network 804. The control module 800 may be implemented as one or more of the modules and/or devices 350, 164, 180, 362 of FIGS. 5-7. The control module 802 includes (i) a FET control circuit 806 or other coarse tuning control circuit, (ii) a varactor bias circuit 808 or other fine tuning bias circuit, (iii) analog-to-digital (A/D) converters 810, 812, and (iv) an adjustment module 813. The hybrid tuning network 804 includes (i) FET switch capacitance circuits 820 or other coarse tuning circuits, and (ii) varactors 822 or other fine tuning circuits. The FET switch capacitance circuits 820 may be implemented as the switch capacitance circuits 508 of FIG. 12. The varactors 822 may be implemented as the varactors 509 of FIG. 12.

The FET control circuit 806 may include and/or be connected to a binary control interface 834. The binary control interface 834 forwards control signals (e.g., control signal CTRL) to driver circuits 838. Each of the driver circuits 838 may be implemented as the switch driver circuit 550 of FIG. 13. The driver circuits 838 drive FETs in the FET switch capacitance circuits 820 including providing DC bias voltages and gate control signals. DC bias voltages provided to the FETs may be measured and/or provided as feedback signals to the A/D converters 810.

The varactor bias circuit 808 includes a digital-to-analog converter (DAC) interface 840 that converts digital bias control signals to analog bias control signals, which are provided to the varactors 822 to set DC bias voltages of the varactors 822. As an example, the DAC interface may include a $2^{12}$-bit DAC. For a 100 pF range, capacitance resolution of the hybrid tuning network 804 is 0.02 pF (100 pF/$2^{12}$). This is at least an order of magnitude better than prior art tuning networks. As an example, one of the analog bias control signals may be provided to the DC bias terminal 520 of FIG. 12. Actual DC bias voltages at the varactors may be measured and/or provided to the A/D converters 812.

The control module 802 and/or the adjustment module 813 controls operation of the circuits 806, 808 based on the feedback signals generated by the A/D converters 810, 812. The control module 802 and/or the adjustment module 813 may control generation of and/or adjust the signals output from the interfaces 834, 840. The control circuit 800 may be operated according to, for example, the method of FIG. 21.

Figure 21:
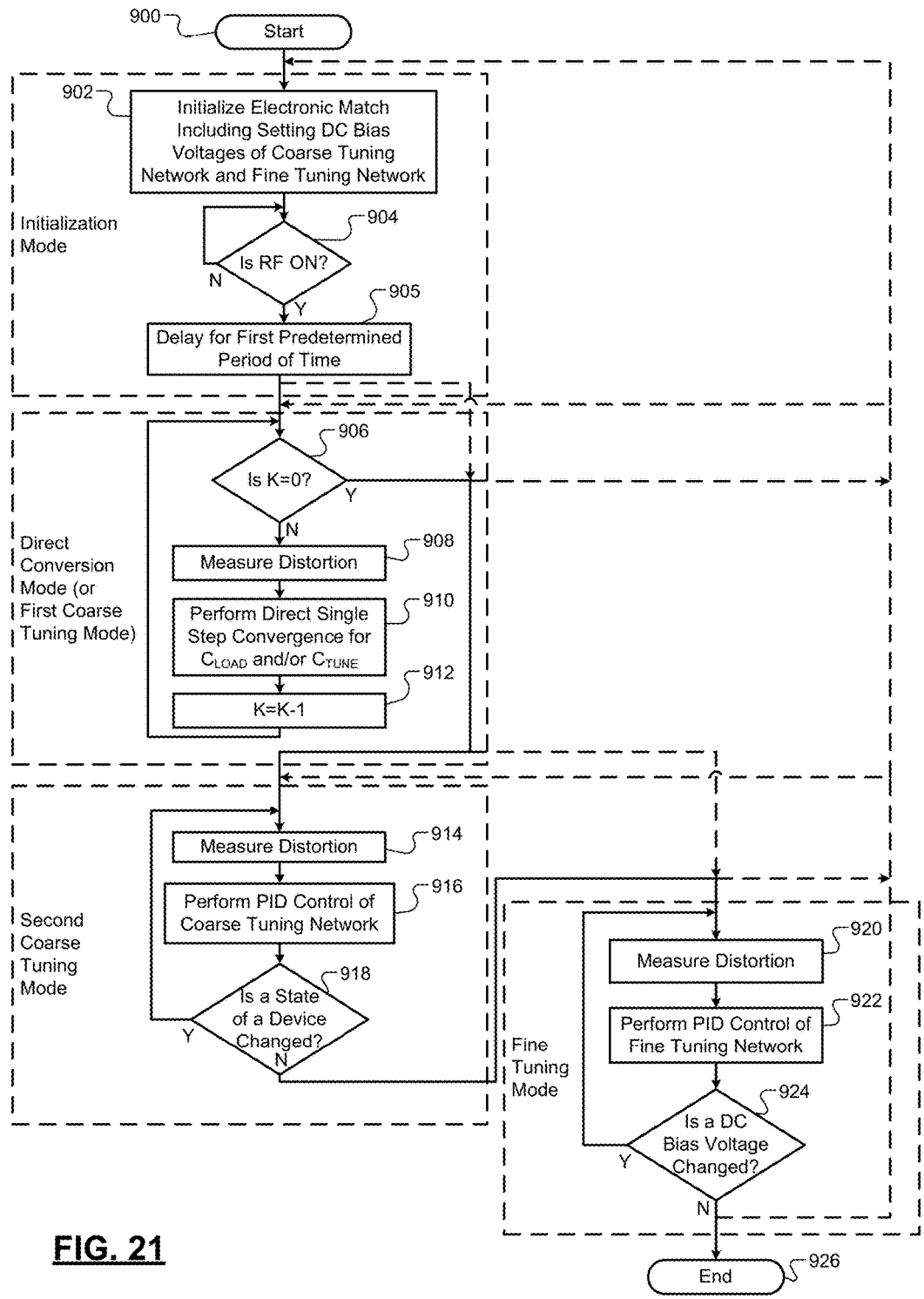
FIG. 21 illustrates a hybrid tuning control method for tuning an electronic variable capacitor of a hybrid tuning network of an impedance matching network in accordance with an embodiment of the present disclosure.

For further defined structure of the modules of FIGS. 5-7 and 20 see below provided method of FIG. 21 and below provided definition for the term "module". The systems, networks, and circuits disclosed herein may be operated using numerous methods, an example method is illustrated in FIG. 21. In FIG. 21, a hybrid tuning control method is shown. Although the following tasks are primarily described with respect to the implementations of FIGS. 5-7, 12-13 and 20-21, the tasks may be easily modified to apply to other implementations of the present disclosure. The tasks may be iteratively performed. The tasks may be performed by control circuit 800 of FIG. 20.

The method may begin at 900. At 902, a circuit (e.g., the control circuit 800) operates in an initialization mode and an electronic match is initialized. This includes setting DC bias voltages of one or more coarse tuning networks and one or more fine tuning networks. The DC bias voltages may be initial predetermined voltages stored in memory (e.g., memory 352). The DC bias voltages may be set by a system user and/or customer. A coarse tuning control circuit (e.g., the FET control circuit 806) generates control signals (e.g., control signal CTRL) to set initial DC bias voltages of the coarse tuning network(s). The control signals are provided to driver circuits (e.g., driver circuits 838), which in turn provide DC bias voltages to the coarse tuning networks (e.g., the FET switch capacitance circuits 820). A fine tuning bias circuit (e.g., the varactor bias circuit 808) sets initial DC bias voltage(s) for the fine tuning network(s).

At 904, a control module (e.g., one of the control modules 162, 180, 350, 362, 802, or a controller) determines whether RF power is ON. For example, the control module may determine whether a RF input signal is being generated and received by the coarse tuning network(s) and the fine tuning network(s). If the RF input signal is being received, task 905 may be performed.

At 905, the control module may wait a predetermined period of time prior to transitioning between the initialization mode and a direct conversion mode (or first coarse tuning mode). The predetermined period of time may be greater than or equal to 0 seconds. This delay may be implemented based on a clock, a timer, a counter or other timing method implemented by the control module.

At 906, the control module and/or an adjustment module (e.g., the adjustment module 813) transitions to the direct conversion mode and determines whether a value K is equal to 0. Although not shown in FIG. 21, K may be set to a predetermined value prior to or at a beginning of operating in the direct conversion mode. K is an integer and may be initially greater than or equal to 0. If K is equal to 0, then task 914 is performed, otherwise task 908 is performed.

At 908, the control module determines one or more distortion quantities (e.g., one of the distortion quantities $d_r$, $d_i$, or d described above). As an example, the distortion quantities may be generated by one of the modules 144, 170, 350 and provided to and/or accessible by the adjustment module. Although the following tasks are described with respect to a single distortion quantity, the tasks may be performed based on multiple distortion quantities.

At 910, the coarse tuning control circuit, based on the distortion quantity, generates control signal(s) to adjust the DC bias voltage(s) initially provided to the coarse tuning network(s). Each iteration of task 910 includes a single adjustment in one or more of the DC bias voltage(s). The control signals are provided to the driver circuits, which in turn provide adjusted DC bias voltage(s) to the coarse tuning network(s). The control signal(s) may be generated based on a relationship or table having predetermined control signal values for distortion quantity ranges. In one embodiment, the fine tuning bias circuit adjusts DC bias voltage(s) for the fine tuning network(s) based on the distortion quantity. In this embodiment and for each iteration of task 910, each of the DC bias voltage(s) of the fine tuning bias circuit is adjusted once. The DC bias voltage(s) for the fine tuning network(s) may be generated based on a relationship or table having predetermined DC bias voltages for distortion quantity ranges. In another embodiment, the fine tuning bias circuit does not adjust the DC bias voltage(s) provided to the fine tuning network(s).

The adjustments performed during task 910 may be associated with large steps or changes in DC bias voltages and/or capacitances of the coarse tuning network(s) and the fine tuning network(s). The DC bias voltages of the coarse tuning network(s) and the fine tuning network(s) are generated as estimates to set the capacitances within predetermined ranges of target capacitance values. Further tuning is performed in tasks 914-922 to more accurately set capacitances of the coarse tuning network(s) and the fine tuning network(s) to the target capacitance values.

Figure 22B:
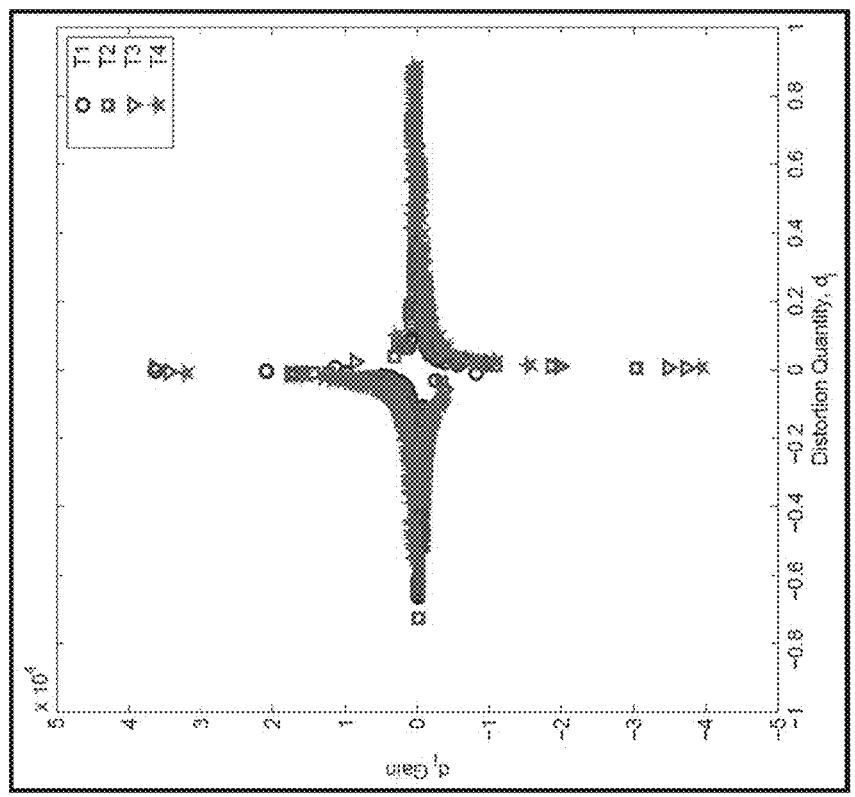
FIG. 22B is a plot of gain versus distortion quantity for a series capacitor in accordance with an embodiment of the present disclosure.
Figure 22A:
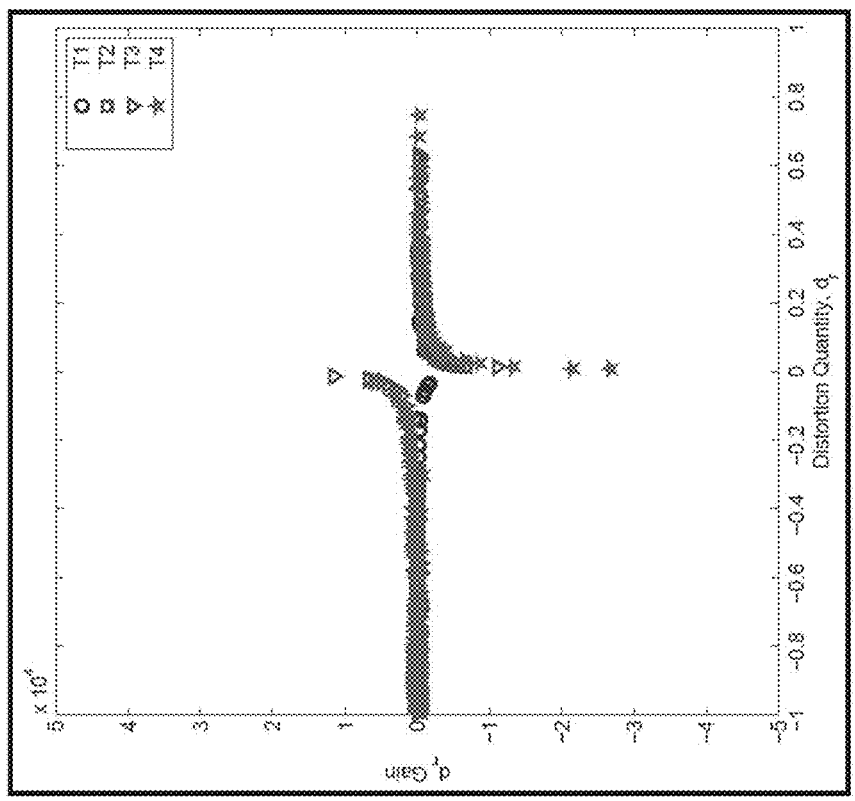
FIG. 22A is a plot of gain versus distortion quantity for a shunt capacitor in accordance with an embodiment of the present disclosure.

The direct convergence performed during task 910 may be performed based on expressions 15-16, where $G_{CLOAD}$ is gain of $C_{LOAD}$ and $G_{CTUNE}$ is gain of $C_{TUNE}$, $d_r$ is a real distortion quantity of d, and $d_i$ is an imaginary distortion quantity of d. Example plots are shown in FIGS. 22A, 22B for four different test cases T1-T4.

$$G_{CLOAD}=205 d_r^{-1} \tag{15}$$

$$G_{CTUNE}=277 d_i^{-1} \tag{16}$$

The gain $G_{CLOAD}$ is directly proportional to an amount of change in DC bias voltages and/or capacitances of $C_{LOAD}$. The gain $G_{CTUNE}$ is directly proportional to an amount of change in DC bias voltages and/or capacitances of $C_{TUNE}$.

If $d_r$ is large, then the gain $G_{CLOAD}$ is near 0 and there is minimal change to the DC bias voltages and corresponding capacitances for $C_{LOAD}$. As $d_r$ decreases in magnitude, the gain $G_{CLOAD}$ increases in magnitude and the DC bias voltages and corresponding capacitances are adjusted. Similarly, if $d_i$ is large, then the gain $G_{CTUNE}$ is near 0 and there is minimal change to the DC bias voltages and corresponding capacitances for $C_{TUNE}$. As $d_i$ decreases in magnitude, the gain $G_{CTUNE}$ increases in magnitude and the DC bias voltages and corresponding capacitances are adjusted. At 912, the control module sets the value K equal to K minus 1.

At 914, the control module and/or the adjustment module transitions from the direct conversion mode to a second coarse tuning mode (or FET control mode). During the second coarse tuning mode, one or more DC bias voltage(s) of the coarse tuning network(s) may be adjusted. During the second coarse tuning mode, DC bias voltage(s) of the fine tuning network(s) are not adjusted. During task 914, the control module and/or the adjustment module measures distortion to generate one or more distortion quantities (e.g., one of the distortion quantities $d_r$, $d_i$, or d described above). Although the following tasks are described with respect to a single distortion quantity, the tasks may be performed based on multiple distortion quantities.

At 916, the control module performs proportional integral derivative (PID) control of the coarse tuning network(s) based on (i) the distortion quantity determined at 914, (ii) target DC bias voltage(s), and (iii) measured DC bias voltage(s) feedback to the adjustment module via, for example, A/D converters (e.g., the A/D converters 810). This includes changing the control signals and thus adjusting DC bias voltage(s) of the coarse tuning network(s).

At 918, if a state of one or more devices (e.g., diode, switch, FET, relay, etc.) has changed due to the PID control at 916, then task 914 is performed, otherwise task 920 is performed. In one embodiment, task 920 is performed after a state of the one or more devices has not been changed for a predetermined number of iterations of tasks 914-918.

At 920, the control module and/or the adjustment module transitions from the second coarse tuning mode to a fine tuning mode (or varactor control module) and determines one or more distortion quantities (e.g., one of the distortion quantities $d_1$, $d_r$, or d described above). Although the following tasks are described with respect to a single distortion quantity, the tasks may be performed based on multiple distortion quantities. During the fine tuning mode, the DC bias voltage(s) of the coarse tuning networks are not adjusted. During the fine tuning mode, the DC bias voltage(s) of the fine tuning networks may be adjusted.

At 922, the control module performs proportional integral derivative (PID) control of the fine tuning network(s) based on (i) the distortion quantity determined at 920, (ii) target DC bias voltage(s), and (iii) measured DC bias voltage(s) feedback to the adjustment module via, for example, A/D converters (e.g., the A/D converters 812). This includes adjusting DC bias voltage(s) of the fine tuning network(s).

At 924, if a DC bias voltage was changed due to the PID control at 922, then task 920 is performed, otherwise the method may end at 926. In one embodiment, task 920 is performed after no DC bias voltages have been changed for a predetermined number of iterations of tasks 920-924. As an alternative to ending at 926 and if there has been a large (more than a predetermined amount of) change in the RF input voltage and/or a large (more than a predetermined amount of) change in distortion, the control module may return to task 906, 908, 914 or 916.

To illustrate that the modes of FIG. 21 can be performed iteratively and in different orders than above-described, dashed-arrows are shown in FIG. 21. For example, at an end of the initialization mode, the direct conversion mode, the second coarse tuning mode, or the fine tuning mode may be performed. At an end of the direct conversion mode, the initialization mode, the second coarse tuning mode or the fine tuning mode may be performed. At an end of the second coarse tuning mode, the initialization mode, the direct conversion mode or the fine tuning mode may be performed. At an end of the fine tuning mode, the initialization mode, the direct conversion mode or the second coarse tuning mode may be performed.

The method of FIG. 21 may be performed for each hybrid tuning network and/or variable reactive element (e.g., $C_{LOAD}$ and/or $C_{TUNE}$) of a plasma processing system. The method of FIG. 21 may be performed for $C_{LOAD}$ while the method of FIG. 21 is being performed for $C_{TUNE}$. As an example, the control module may be operating in one of the initialization, direct conversion, second coarse tuning and fine tuning modes for a first hybrid tuning network and/or first variable reactive element while operating in a different one of the initialization, direct conversion, second coarse tuning and fine tuning modes for a second hybrid tuning network and/or second variable reactive element.

The above-described tasks are meant to be illustrative examples; the tasks may be performed sequentially, synchronously, simultaneously, continuously, during overlapping time periods or in a different order depending upon the application. Also, any of the tasks may not be performed or skipped depending on the implementation and/or sequence of events.

Control Summary

A traditional tuning network typically operates based on a function of frequency and includes two variable reactive elements. The hybrid tuning networks disclosed herein include two variable reactive elements $C_{LOAD}$, $C_{TUNE}$, where each of the variable reactive elements has two or more control actuators (or coarse and fine tune actuators). As above-described, a solid-state impedance network that includes varactors has a capacitance variation challenge due to changes in varactor impedance as a result of changes in applied RF voltage. This is readily seen in FIG. 9A, where capacitance varies for a varying applied RF power (voltage) with a constant DC bias voltage applied. The above-described implementations include controlling reactances of eVCs including varactors using fine and coarse tuning actuators (e.g., the control module 802, the FET control circuit 806, the varactor bias circuit 808, the driver circuits 838 of FIG. 20). FET switches may be referred to as coarse actuators and a varactor bias circuit may be referred to as a fine tuning actuator. A set of actuators per eVC enables a coordinated control methodology to quickly tune to variable load conditions and change applied RF voltages during plasma ignition and steady-state plasma operation with varying power conditions.

The sets of actuators allow for tuning of a hybrid tuning network and/or variable reactance element with different control sequences at a certain moment in time, for example: (1) simultaneous fine and course tuning; (2) course tuning only; and (3) fine tuning only. Prior to an ignition process, a preset configuration of the fine and course actuators are initially established, as described with respect to task 902. Coarse tuning networks and/or FET switches provide course tuning during a transition from a vacuum state to a state of formulating plasma.

As RF input voltage varies, a control module (or impedance controller) maintains a tuned condition via coarse and/or fine adjustments. The fine adjustments are provided via fine tuning networks and/or varactors. Coarse and fine tune actuators may be controlled in different coarse/fine tune sequences. As an example, a coarse/fine tune sequence may include: coarse tuning only; coarse tuning followed by fine tuning; and/or fine tuning only. This sequence of actuation also enables different tuning rates for each actuator. For example, FET switching may occur at a higher rate than DC bias voltage adjustment of varactors. Rates of the actuators may be adjusted during a tuning session, thereby providing variable rate control of coarse and fine tuning actuators. These rates may be varied while RF input voltage is varied.

Actuation Examples

If a hybrid tuning network includes a coarse tuning network with 5 FET switch capacitance circuits, then $2^5$ or 32 possible combinations are available in providing an overall capacitance of the coarse tuning network. Four implementation examples are described below with respect to FIGS. 23A-23D for this type of hybrid tuning network. Tasks performed with respect to these examples may be performed for each eVC (e.g., $C_{LOAD}$ and $C_{TUNE}$) of an impedance matching network.

Figure 23A:
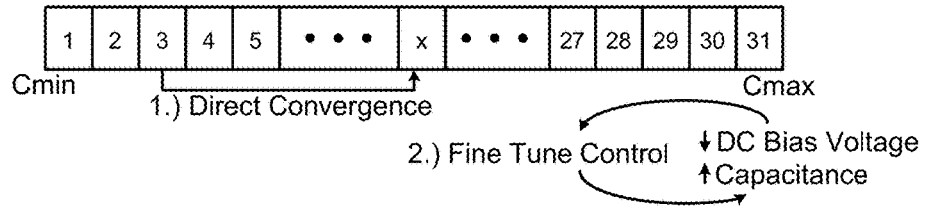
FIG. 23A is a capacitance bar diagram illustrating a first example of the method of FIG. 21.

As a first example and referring to FIGS. 21 and 23A, the initialization mode may be performed. During the initialization mode combination 3 may be selected. Combination 3 may be changed to combination x during a subsequent iteration of the direct conversion mode, as identified by step 1 in FIG. 23A. Control may determine that the second coarse tuning mode can be skipped and the fine tuning mode may be performed. This may include decreasing a DC bias voltage to varactors of a fine tuning network to increase capacitance, as identified by step 2 in FIG. 23A.

Figure 23B:
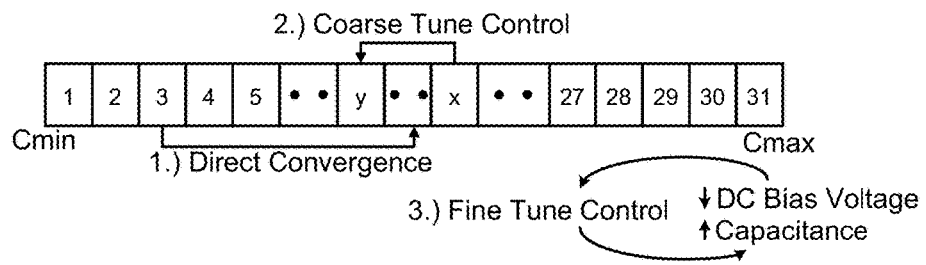
FIG. 23B is a capacitance bar diagram illustrating a second example of the method of FIG. 21.

As a second example and referring to FIGS. 21 and 23B, the initialization mode may be performed. During the initialization mode combination 3 may be selected. Combination 3 may be changed to combination x during a subsequent iteration of the direct conversion mode, as identified by step 1 in FIG. 23B. Combination x may be changed to combination y during an iteration of the direct convergence mode, as identified by step 2 in FIG. 23B. The fine tuning mode may be performed subsequent to performing the direct convergence mode. This may include decreasing a DC bias voltage to varactors of a fine tuning network to increase capacitance, as identified by step 3 in FIG. 23B.

Figure 23C:
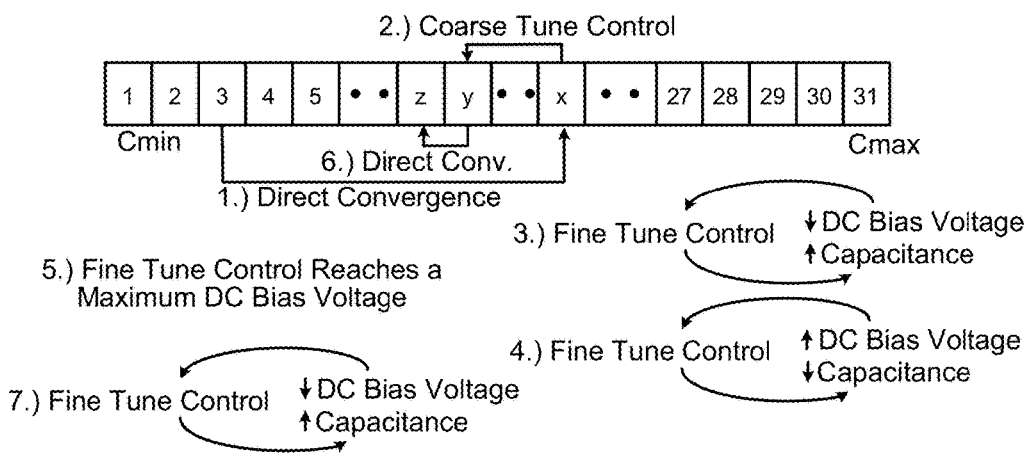
FIG. 23C is a capacitance bar diagram illustrating a third example of the method of FIG. 21.

As a third example and referring to FIGS. 21 and 23C, the initialization mode may be performed. During the initialization mode combination 3 may be selected. Combination 3 may be changed to combination x during a subsequent iteration of the direct conversion mode, as identified by step 1 in FIG. 23C. Combination x may be changed to combination y during an iteration of the direct convergence mode, as identified by step 2 in FIG. 23C. The fine tuning mode may be performed subsequent to performing the direct convergence mode. This may include decreasing a DC bias voltage to varactors of a fine tuning network to increase capacitance, as identified by step 3 in FIG. 23C. Due to plasma changes, step 4 may be performed including performing another iteration of the fine tuning mode including increasing the DC bias voltage to the varactors to decrease capacitance. During this adjustment, a maximum DC bias voltage may be reached, identified by number 5 in FIG. 23C. Another iteration of the direct convergence mode is then performed to change the combination from y to z, identified as step 6 in FIG. 23C. Another iteration of the fine tuning mode may then be performed to decrease the DC bias voltage to the varactors and increase capacitance, as identified by step 7 of FIG. 23C.

Figure 23D:
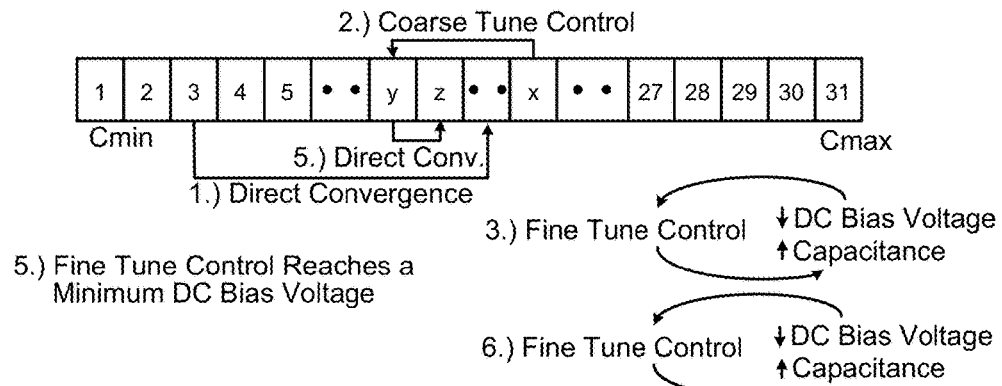
FIG. 23D is a capacitance bar diagram illustrating a fourth example of the method of FIG. 21.

As a fourth example and referring to FIGS. 21 and 23D, the initialization mode may be performed. During the initialization mode combination 3 may be selected. Combination 3 may be changed to combination x during a subsequent iteration of the direct conversion mode, as identified by step 1 in FIG. 23D. Combination x may be changed to combination y during an iteration of the direct convergence mode, as identified by step 2 in FIG. 23D. The fine tuning mode may be performed subsequent to performing the direct convergence mode. This may include decreasing a DC bias voltage to varactors of a fine tuning network to increase capacitance, as identified by step 3 in FIG. 23D. During step 3, a minimum DC bias voltage may be reached (identified by number 4 in FIG. 23D) resulting in control to switch to the direct convergence mode to switch from combination y to combination z. This is shown by step 5 in FIG. 23D. Another iteration of the fine tuning mode may then be performed to decrease the DC bias voltage to the varactors and increase capacitance, as identified by step 6 in FIG. 23D.

Figure 24:
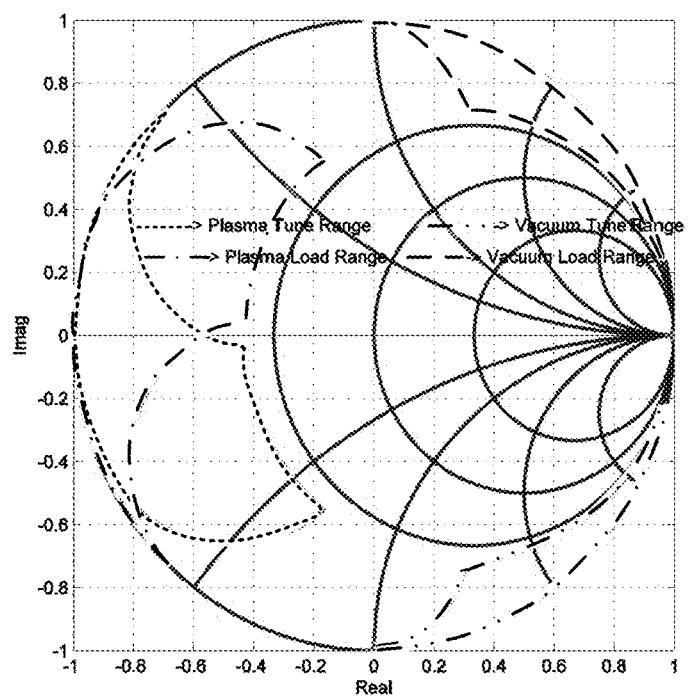
FIG. 24 is a Smith chart of bi-model impedance ranges of an impedance matching network including a hybrid tuning network in accordance with an embodiment of the present disclosure.

FIG. 24 is a Smith chart of bi-model impedance ranges (or tune spaces) of an impedance matching network including a hybrid tuning network. A challenge with RF power delivery systems is accounting for changes in load conditions during periods when plasma is not present, during transition periods when plasma is being generated, and during periods when plasma is present in a plasma chamber. The combination of the calibration and dual-actuation control techniques disclosed herein provide an additional enhancement. The impedance matching networks disclosed herein may operate in a single model mode or a multi-model mode (e.g., a bi-model mode). The parallel configurations disclosed herein that each include a coarse tuning network and a fine tuning network for a corresponding eVC enable operation in multi-modal tune spaces. This allows for operating in the same or different tune spaces (i) prior to plasma generation, (ii) during plasma generation, and (iii) while plasma exists in a plasma chamber.

During the process of plasma ignition, impedances of eVCs are controlled while transitioning from a vacuum state (no active plasma, or low energy particle state) to a high-density plasma glow state. The eVCs are configured to allow a portion of a tune space can be used to tune a first impedance and a second portion of the tune space can be used to tune a second impedance. Thus, multiple load impedance regions may exist. One instantiation that will benefit from a bi-modal tune space is to (1) perform tuning for a vacuum condition of a reactor (or generator) based on a first region, and (2) perform tuning for a plasma process based on a second region. Examples of different load and tune ranges (or regions) are shown in FIG. 24 for $C_{LOAD}$ and $C_{TUNE}$. The benefit of this approach is that a RF power supply is able to deliver power into a near 50Ω load while the load is in a vacuum state. This was not achievable using a traditional impedance matching circuit. The multi-modal approach allows the RF power supply to deliver power into a smaller impedance region around a 50Ω load, which results in more reliable RF power delivery, less system complexity, and better processing conditions. As an example, the vacuum regions of FIG. 24 are provided with a capacitance range of $C_{TUNE}$ being 30-150 pF. The plasma processing regions of FIG. 24 are provided with a capacitance range for FET switches being 400-1500 pF for $C_{LOAD}$ or $C_{TUNE}$. Different multi-modal impedance ranges can be achieved with different impedance tuning circuits, which are controlled as described above.

Figure 25:
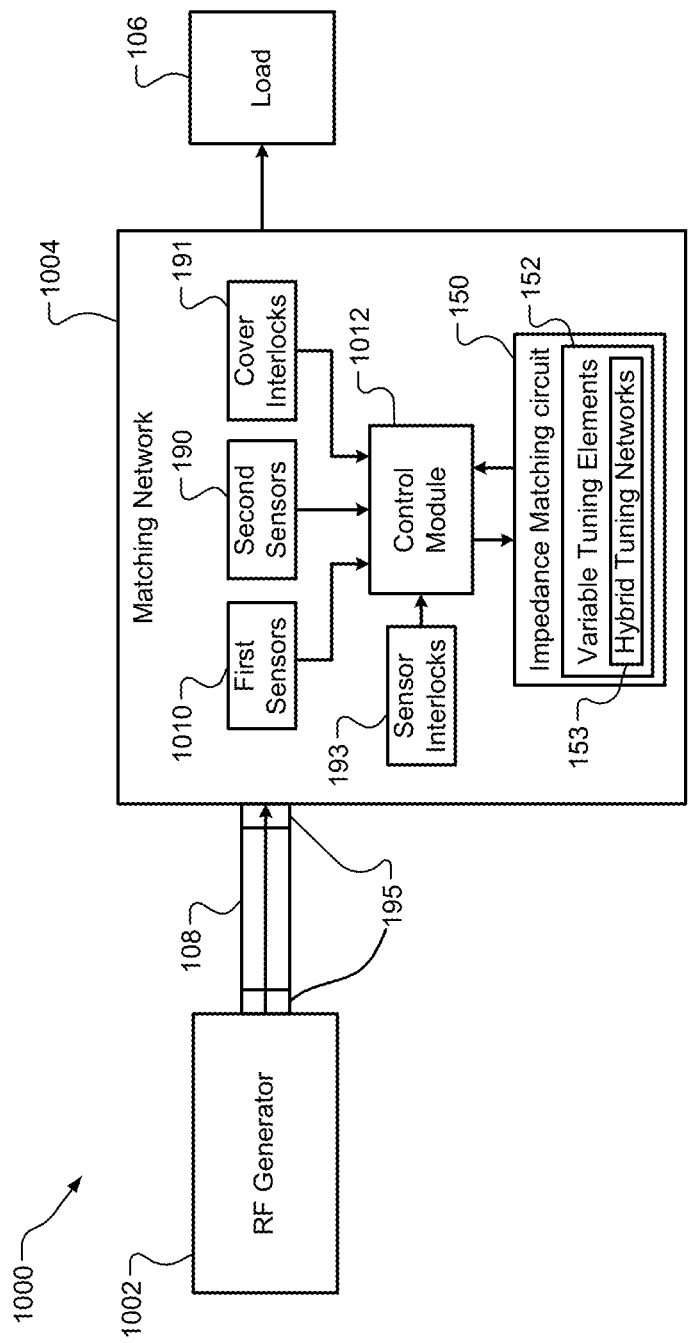
FIG. 25 is a functional block diagram of a RF power system including autonomous tuning at impedance matching network in accordance with an embodiment of the present disclosure.

As an alternative to providing impedance matching tuning control via a RF generator, autonomous tuning can be performed at an impedance matching network. FIG. 25 shows a RF power system 1000 including a RF generator 1002, an impedance matching network 1004 and the load 106. The RF generator 1002 may operate similarly to the RF generator 102 of FIGS. 5-6 with regards to generating a RF signal. The RF generator 1002 may not include one or more of the modules 144, 160, 164, 170, 176, 180, the circuits 146, 172, and the summers 162, 178 shown in FIGS. 5-6. The RF signal is provided to the impedance matching network 1004 via the cable 108. The transmission line interlocks 195 may be included. The impedance matching network 1004 may include the impedance matching circuits 150, second sensors 190, interlocks 191, 193, first sensors 1010 and a control module 1012. The first sensors may monitor RF signals, voltages, current, power, reverse power, forward power and/or or other parameters associated with the cable 108.

The parameters detected by the sensors 190, 1010 are provided to the control module 1012. The control module 1012 controls operation of the impedance matching circuit 150 including the variable tuning elements 152 and the hybrid tuning networks 153 based on the parameters received from the sensors 190, 1010. The control module 1012 may operate similarly to the modules 164, 180, 352, 362 of FIGS. 5-7 and control module 802 of FIG. 20 and may perform the method of FIG. 21. This allows the hybrid tuning networks 153 to be controlled by the control module 1012 at the impedance matching network 1004 rather than remotely by the RF generator 1002. This includes generate control signals and the DC bias voltages described herein to adjust capacitances of the hybrid tuning networks of $C_{LOAD}$ and $C_{TUNE}$.

Although the above-described implementations are primarily described with respect to eVCs, variable inductors that are electronically controlled may be used as solid-state tunable devices. Also, although FET switches are primarily disclosed for use in coarse tuning networks, PIN diodes may be used and switched, such that tolerable reflected power is achieved for a broad tune space and a corresponding RF power supply is configured for load power control. The load power control enables power regulation with non-zero reflected power.

The above-described embodiments provide solid-state impedance matching with variable reactance control. This is enhanced with techniques to reduce component stress. A sealed enclosure is also provided with a self-contained heat exchanger for improved cooling and degradation prevention.

Application Examples

The semiconductor manufacturing industry has appreciated the ability for tuning actuators to tune at time scales associated with plasma time constants and RF rise times. While frequency control has enhanced thin-films processes and allowed other techniques to evolve to support next generation device fabrication, these techniques have limited actuator tuning rates. The hybrid tuning networks disclosed herein have fast tuning actuators. Application examples are provided below that can benefit from the disclosed techniques.

Pulsing:

RF power delivery during periodic RF power transitions can cause impedance fluctuations. For improved power delivery, the solid-state actuators disclosed herein enable a broader impedance tuning space relative to a limited frequency range. The more time the RF generator(s) is coupled to a 50Ω load during these periodic transitions, the more repeatable and reproducible is RF power delivery. The improved repeatability and reproducability corresponds to improved (i) plasma parameter control (e.g., electron temperature, density, and potential), (ii) tailored pulsed waveforms, and (iii) thin-film processing.

Continuous Plasma Processing:

Reactor temperature variation occurs during a transition from plasma ignition to steady-state cycling due to plasma and gas temperature heating. Additionally, process chemistry cycles vary through ionization and dissociations. This variance can be increased due to particle contamination. It is desirable to have plasma continuously ON for many plasma treatment steps in the manufacturing of semiconductor devices. This improves yields with steady-state plasma and reactor conditioning throughout the processing of multiple wafers and decreases manufacturing throughput time. The challenge imposed by continuous plasma processing is the variation of impedances during the multiple steps performed to process a wafer. High-speed impedance tuning actuators disclosed herein enable continuous plasma processing through a broader range of impedance space corresponding to a wider plasma process tune space.

Sequential Thin-Film Manufacturing Processing Scheme:

A plasma-enhanced atomic layer deposition (PEALD) process is generally defined by a sequential set of mechanical and RF steps that are repeated for particular deposition objectives. Atomic layer etch (ALE), though not yet adopted in a high-volume manufacturing environment, is expected to be defined in a similar manner. During these sequential thin-film manufacturing steps, fast and repeatable ignition is desired. The electronic variable devices disclosed herein enable these types of processes to advance with more repeatable impedance matching.

Impedance Matching:

50Ω impedance matching is common. The impedance matching networks disclosed herein provide a wide tune space for impedance matching with (i) reduced control system complexity, and (ii) a potential for less silicon to be used in a RF generator while providing increased reliability for a RF power delivery system.

Arbitrary Waveform Generation:

Coupling power to a non-sinusoidal periodic impedance variation greatly benefits from the tuning actuators disclosed herein, which have time scales that are relative to a broadband response of a power supply. This creates a near steady-state impedance for constant voltage/current requirements of the RF power supply.

A First Specific Reactor—High Density Plasma (HDP):

Biased RF power supplies draw an ion flux toward a surface for material treatment. During transients, it is desired to have this ion flux be repeatable and reproducible for a controlled material removal rate. For high-density plasma sources, plasma generation is independent of ion energy levels. The high-speed electronic tuning devices disclosed herein couple and maintain load impedance closer to design objectives of a power supply, which prevents large power gradients that impose power drop outs and power swings. Faster tuning actuators also enable controllable RF power delivery during mode transitions between electric field coupling to magnetic field coupling, which increases the operational process space for the reactor to serve wider thin-film manufacturing processes.

A Second Specific Reactor—Capacitively-Coupled Plasma (CCP):

The electronic variable devices and actuators disclosed herein benefit CCP bias similarly to the benefits of a HDP source with one notable subtly. The source RF power supply responsible for plasma generation is not nearly as independent in the case for HDP. For this reason, control of the RF power responsible for plasma generation is needed to maintain a collisionless sheath. Applying fast tuning solid-state actuators to a CCP reactor benefits selectivity associated with ion energy levels, sheath performance as it relates to plasma density, and stabilization of the RF power delivery to ameliorate plasma parameters for highly reactive plasma sources.

A Third Specific Reactor—a Cold Atmospheric Plasma Source (CAPS):

Stability of RF power delivery in atmospheric plasma sources are a significant challenge. The challenges are associated with the requirements of the plasma application and the variability of the plasma source. The plasma source has near term and long term time constants associated with the ignition and gradual evolution toward a steady-state condition. Post ignition, many factors contribute to variability that must be countered to deliver a repeatable plasma source to the application. Coupling this type of plasma source with high-speed solid-state tuning actuators accelerates the adoption of many applications associated with CAPS.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or ore of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Although the terms first, second, third, etc. may be used herein to describe various elements, components, loops, circuits, and/or modules, these elements, components, loops, circuits, and/or modules should not be limited by these terms. These terms may be only used to distinguish one element, component, loop, circuit or module from another element, component, loop, circuit or module. Terms such as "first," "second," and other numerical terms when used herein do not imply a sequence or order unless clearly indicated by the context. Thus, a first element, component, loop, circuit or module discussed below could be termed a second element, component, loop, circuit or module without departing from the teachings of the example implementations disclosed herein.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

In this application, apparatus elements described as having particular attributes or performing particular operations are specifically configured to have those particular attributes and perform those particular operations. Specifically, a description of an element to perform an action means that the element is configured to perform the action. The configuration of an element may include programming of the element, such as by encoding instructions on a non-transitory, tangible computer-readable medium associated with the element.

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

None of the elements recited in the claims are intended to be a means-plus-function element within the meaning of 35 U.S.C. § 112(f) unless an element is expressly recited using the phrase "means for," or in the case of a method claim using the phrases "operation for" or "step for."

What is claimed is:

1. A first electronic variable capacitance comprising:
a coarse tuning network comprising a switchable circuit configured to (i) receive a first radio frequency (RF) input signal from a RF generator of a plasma processing system, (ii) output a first RF output signal to a reference terminal or to a load, and (iii) receive a first direct current (DC) bias voltage, wherein the switchable circuit is configured to be switched between a first state and a second state, and wherein a capacitance of the switchable circuit is based on the first DC bias voltage while in the first state and is not based on the first DC bias voltage while in the second state; and
a fine tuning network connected in parallel with the coarse tuning network, the fine tuning network comprises a back-to-back diode varactor, wherein the back-to-back diode varactor is configured to receive a second DC bias voltage and comprises
a first diode configured to receive the first RF input signal, and
a second diode connected in a back-to-back configuration with the first diode and configured to output a second RF output signal to the reference terminal or to the load, wherein a capacitance of the back-to-back diode varactor is based on the second DC bias voltage.

2. The first electronic variable capacitance of claim 1, wherein:
the fine tuning network is connected in parallel with the coarse tuning network between (i) a RF input terminal and (ii) the reference terminal or the load;
the RF input terminal is configured to receive the first RF input signal; and
the switchable circuit is configured to output the first RF output signal to the reference terminal or the load; and
the back-to-back diode varactor is configured to output the second RF output signal to the reference terminal or the load.

3. The first electronic variable capacitance of claim 1, wherein:
the switchable circuit comprises a first switching device and a second switching device;
the first switching device and the second switching device are in an OFF state when the switchable circuit is in the first state; and
the first switching device and the second switching device are in an ON state when the switchable circuit is in the second state.

4. The first electronic variable capacitance of claim 3, further comprising a capacitor,
wherein the capacitance of the switchable circuit is (i) based on the capacitor while in the second state, and (ii) based on the capacitor, a capacitance of the first switching device and a capacitance of the second switching device while in the first state.

5. The first electronic variable capacitance of claim 1, wherein the second DC bias voltage is received across the first diode and the second diode.

6. The first electronic variable capacitance of claim 1, wherein:
the coarse tuning network comprises a plurality of switch capacitance circuits connected in parallel;
each of the plurality of switch capacitance circuits has a respective one of a plurality of different capacitances;
a sum of the plurality of different capacitances provides a total capacitance of the coarse tuning network; and
each of the plurality of different capacitances is based on the first DC bias voltage while the switchable circuit is in the first state.

7. The first electronic variable capacitance of claim 1, wherein the fine tuning network comprises a plurality of back-to-back diode varactors connected in parallel.

8. The first electronic variable capacitance of claim 7, wherein each of the plurality of back-to-back diode varactors comprises a plurality of back-to-back diode pairs connected in parallel between (i) the RF input terminal and (ii) a bias input terminal and the RF output terminal or load.

9. The first electronic variable capacitance of claim 1, wherein the fine tuning network comprises a plurality of capacitors connected in parallel between the second diode and the RF output terminal or load.

10. An impedance matching network comprising:
the first electronic variable capacitance of claim 1; and
a transformer connected to an input of the first electronic variable capacitance and configured to (i) transform an input impedance of the impedance matching network, and (ii) convert a second RF input signal received from the RF generator to the first RF input signal.

11. An impedance matching network comprising:
the first electronic variable capacitance of claim 1, wherein the first electronic variable capacitance comprises an input terminal, and wherein the first electronic variable capacitance receives the first RF input signal at the input terminal; and
a transformer connected to the input terminal and between the first electronic variable capacitance and the load, wherein the transformer converts a RF input signal received from the RF generator to the first RF input signal.

12. A dual enclosure comprising:
an outer enclosure, wherein the outer enclosure is airtight;
an inner enclosure disposed within the outer enclosure and comprising the first electronic variable capacitance of claim 1;

a heat exchanger configured to cool air passing through the heat exchanger; and
one or more fans to direct air (i) through the heat exchanger, and (ii) between (a) an area external to the inner enclosure and in the outer enclosure and (b) an area in the inner enclosure,
wherein the first electronic variable capacitance is disposed within the inner enclosure and cooled by circulation of air via the one or more fans through the heat exchanger.

13. An impedance matching network comprising:
the first electronic variable capacitance of claim 1; and
a second electronic variable capacitance configured to receive the first RF input signal,
wherein one of the first electronic variable capacitance and the second electronic variable capacitance is a shunt capacitance, and
wherein the other one of the first electronic variable capacitance and the second electronic variable capacitance is a shunt capacitance or a series capacitance.

14. A system comprising:
the impedance matching network of claim 13;
a module configured to (i) determine a distortion quantity, (ii) generate a control signal based on the distortion quantity, and (iii) generate the second DC bias voltage based on the distortion quantity; and
a driver circuit configured to generate the first DC bias voltage based on the control signal.

15. The system of claim 14, wherein the module is configured to determine for a period of time whether to perform (i) coarse tuning via the coarse tuning network, (ii) fine tuning via the fine tuning network, or (iii) both coarse tuning and fine tuning via the coarse tuning network and the fine tuning network.

16. The system of claim 14, wherein the module is configured to (i) skip performing coarse tuning via the coarse tuning network, and (ii) perform fine tuning via the fine tuning network.

17. The system of claim 14, wherein the module is configured to iteratively perform (i) coarse tuning via the coarse tuning network, (ii) fine tuning via the fine tuning network, or (iii) both coarse tuning via the coarse tuning network and fine tuning via the fine tuning network.

18. A system comprising:
the first electronic variable capacitance of claim 1; and
a module configured to while operating in a direct convergence mode (i) determine a distortion quantity, and (ii) based on an initial state of the first electronic variable capacitance and the distortion quantity, perform a single step convergence to adjust capacitance of the first electronic variable capacitance directly from an initial capacitance to an estimated target capacitance.

19. A method comprising:
determining a distortion quantity, wherein the distortion quantity is an indication of an amount of reflected power provided from a radio frequency (RF) generator to a plasma processing chamber;
based on the distortion quantity, determining a gain value for an electronic variable capacitance, wherein the electronic variable capacitance is a shunt capacitance or a series capacitance of an impedance matching network connected between the RF generator and the plasma processing chamber, wherein the electronic variable capacitance comprises a switchable circuit and a varactor, and wherein the varactor is connected in parallel with the switchable circuit; and
during a direct convergence mode,
adjusting a first direct current (DC) bias voltage from an initial DC bias voltage directly to a first target voltage, and
supplying the first target voltage to the switchable circuit or the varactor.

20. The method of claim 19, further comprising, during the direct convergence mode:
adjusting the first DC bias voltage from the initial DC bias voltage directly to the first target voltage; and
supplying the first target voltage to the switchable circuit, wherein a second DC bias voltage supplied to the varactor is not adjusted during the direct convergence mode.

21. The method of claim 19, further comprising, during the direct convergence mode:
adjusting the first DC bias voltage from the initial DC bias voltage directly to the first target voltage;
supplying the first target voltage to the switchable circuit;
adjusting a second DC bias voltage from a second initial DC bias voltage directly to a second target voltage; and
supplying the second target voltage to the varactor.

22. The method of claim 19, further comprising:
performing a predetermined number of iterations of the direct convergence mode, wherein the predetermined number of iterations is greater than or equal to 1; and
transitioning from the direct convergence mode to a coarse tuning mode or a fine tuning mode upon completing the predetermined number of iterations.

23. The method of claim 22, wherein:
the first target voltage is supplied to the switchable circuit during the direct convergence mode;
the coarse tuning mode includes adjusting the first target voltage; and
the fine tuning mode includes adjusting a second target voltage supplied to the varactor.

24. The method of claim 23, wherein, during the coarse tuning mode, the first DC bias voltage is adjusted based on the first target voltage and a measured DC bias voltage at the switchable circuit.

25. The method of claim 23, wherein, during the fine tuning mode, a second DC bias voltage supplied to the varactor is adjusted between the second target voltage and a measured DC bias voltage at the varactor.

26. The method of claim 23, further comprising updating the distortion quantity during the coarse tuning mode and during the fine tuning mode.

27. The method of claim 19, comprising supplying the first DC bias voltage across diodes of the varactor,
wherein the diodes are arranged in a back-to-back series configuration.

28. A controller comprising:
an adjustment module configured to determine a distortion quantity corresponding to a transfer of RF power from a RF generator to an impedance matching network of a plasma processing system;
a control circuit configured to (i) generate a control signal based on the distortion quantity, and (ii) output the control signal to a driver circuit to provide a first direct current (DC) bias voltage to and set a capacitance of a switchable circuit of a hybrid tuning network in the impedance matching network; and
a bias circuit configured to (i) generate a second DC bias voltage based on the distortion quantity, and (ii) output the second DC bias voltage to a varactor of the hybrid tuning network, wherein the adjustment module is configured to
  receive a first feedback signal based on a condition of the switchable circuit,
  receive a second feedback signal based on a condition of the varactor,
  adjust the control signal based on the first feedback signal, and
  adjust the second DC bias voltage based on the second feedback signal.

29. The controller of claim 28, further comprising:
a first analog-to-digital converter configured to (i) receive a bias voltage signal from the switchable circuit, and (ii) convert the bias voltage signal to the first feedback signal; and
a second analog-to-digital converter configured to (i) receive a bias voltage signal from the varactor, and (ii) convert the bias voltage signal from the varactor to the second feedback signal.

30. The controller of claim 28, wherein:
the control circuit and the bias circuit are configured to operate in an initialization mode prior to the hybrid tuning network receiving a radio frequency (RF) input signal from the RF generator;
while in the initialization mode, the control circuit is configured to generate the control signal, such that the first DC bias voltage is set to a first initial predetermined voltage; and
while in the initialization mode, the bias circuit is configured to set the second DC bias voltage to a second initial predetermined voltage.

31. The controller of claim 28, wherein:
the control circuit and the bias circuit are configured to operate in a direct convergence mode when the hybrid tuning network receives the RF input signal from the RF generator;
while in the direct convergence mode, the control circuit is configured to generate the control signal, such that the first DC bias voltage is directly adjusted from an initial DC bias voltage to a target DC bias voltage, wherein the initial DC bias voltage is generated prior to the hybrid tuning network receiving the RF input signal; and
while in the direct convergence mode, the bias circuit either (i) does not adjust the second DC bias voltage or (ii) directly adjusts the second DC bias voltage from a second initial DC bias voltage to a second target DC bias voltage, wherein the second initial DC bias voltage is generated prior to the hybrid tuning network receiving the RF input signal.

32. The controller of claim 28, wherein:
the control circuit is configured to operate in a coarse tuning mode while the hybrid tuning network is receiving the RF input signal from the RF generator;
while in the coarse tuning mode, the control circuit is configured to generate the control signal, such that the first DC bias voltage is adjusted and the capacitance of the switchable circuit is adjusted; and
while in the coarse tuning mode, the bias circuit does not adjust the second DC bias voltage.

33. The controller of claim 32, wherein the control circuit, while in the coarse tuning mode, is configured to perform proportional integral derivative control of the first DC bias voltage via adjustment of the control signal.

34. The controller of claim 28, wherein:
the bias circuit is configured to operate in a fine tuning mode while the hybrid tuning network is receiving the RF input signal from the RF generator;
while in the fine tuning mode, the control circuit does not adjust the control signal; and
while in the fine tuning mode, the bias circuit is configured to adjust the second DC bias voltage to adjust capacitance of the varactor.

35. The controller of claim 34, wherein the bias circuit is configured to perform proportional integral derivative control of the second DC bias voltage.

36. A electronic variable capacitance comprising:
a first diode connected at a first end to a direct current (DC) bias voltage terminal; and
a second diode connected to a second end of the first diode and in a back-to-back varactor configuration with the first diode,
wherein
  the second diode is configured to receive a radio frequency (RF) signal from a RF generator of a plasma processing system,
  the DC bias voltage is provided across the first diode and the second diode,
  the second diode, based on the DC bias voltage, is forward biased to a voltage that is less than a built-in potential of the second diode,
  the first diode, based on the DC bias voltage, is reversed biased while the second diode is forward biased, such that the first diode and the second diode perform as a variable capacitor while in an OFF state, and
  the first diode outputs a RF output signal at the first end of the first diode.

37. The electronic variable capacitance of claim 36, wherein a capacitance of a combination of the first diode and the second diode is at a peak when the DC bias voltage is 0.

38. The electronic variable capacitance of claim 36, wherein the first diode and the second diode are OFF when the DC bias voltage is 0.

39. The electronic variable capacitance of claim 36, wherein, based on the DC bias voltage:
a capacitance of the first diode is less than a capacitance of the second diode; and
the capacitance of the second diode is a zero bias junction capacitance.

40. The electronic variable capacitance of claim 36, further comprising:
a third diode; and
a fourth diode connected in a back-to-back configuration with the third diode, wherein the third diode and the fourth diode are connected in parallel.

41. The electronic variable capacitance of claim 40, further comprising:
a first resistance connected between (i) the first diode and the second diode, and (ii) a reference terminal; and
a second resistance connected between (i) the third diode and the fourth diode, and (ii) the reference terminal.

42. The electronic variable capacitance of claim 36, further comprising:
a first inductor connected between the DC bias voltage terminal and the first end of the first diode;
a second inductor connected between the second diode and a reference terminal; and
a capacitor connected between (i) the first inductor and the first diode, and (ii) a RF output terminal of the electronic variable capacitance.

43. The electronic variable capacitance of claim 36, further comprising a resistor connected across the first diode.

* * * * *